(12) United States Patent  
Etoh

(10) Patent No.: US 7,518,170 B2
(45) Date of Patent: Apr. 14, 2009

(54) BACK ILLUMINATED IMAGING DEVICE

(75) Inventor: Takeharu Etoh, Mino (JP)

(73) Assignees: Takeharu Etoh, Osaka (JP); Shimadzu Corporation, Kyoto (JP)

( * ) Notice: Subject to any disclaimer, the term of this patent is extended or adjusted under 35 U.S.C. 154(b) by 198 days.

(21) Appl. No.: 11/663,263

(22) PCT Filed: Sep. 21, 2005

(86) PCT No.: PCT/JP2005/017370

§ 371 (c)(1),
(2), (4) Date: Mar. 20, 2007

(87) PCT Pub. No.: WO2006/033345

PCT Pub. Date: Mar. 30, 2006

(65) Prior Publication Data

US 2008/0149967 A1    Jun. 26, 2008

(30) Foreign Application Priority Data

Sep. 21, 2004    (JP) ............................. 2004-273668

(51) Int. Cl.
*H01L 27/00* (2006.01)

(52) U.S. Cl. ................. 257/291; 257/292; 257/293; 250/208.1

(58) Field of Classification Search ................. 257/291, 257/292, 293, E27.133; 250/208.1
See application file for complete search history.

(56) References Cited

U.S. PATENT DOCUMENTS 4,811,068 A    3/1989    Kinoshita

FOREIGN PATENT DOCUMENTS

| JP | 60-028265 A | 2/1985 |
| JP | 2001-345441 A | 12/2001 |
| JP | 2004-235621 A | 8/2004 |
| WO | WO-01/73849 A1 | 10/2001 |
| WO | WO-2004/061965 A1 | 12/2003 |

*Primary Examiner*—Evan Pert
*Assistant Examiner*—Tan N Tran
(74) *Attorney, Agent, or Firm*—Birch, Stewart, Kolasch & Birch, LLP

(57) ABSTRACT

A back illuminated imaging device 1 comprises a plurality charge blocking regions 19 which are arranged on a front surface 12 side, embedded in CCD charge transferring paths 21, and in which a first thickness T1 measured from the front surface 12 of first portions 19a extending along the CCD charge transferring paths 21 is larger than a first thickness T2 of second portions 19b extending along channel stops 20.

11 Claims, 28 Drawing Sheets

POSITION ON LINE "D"

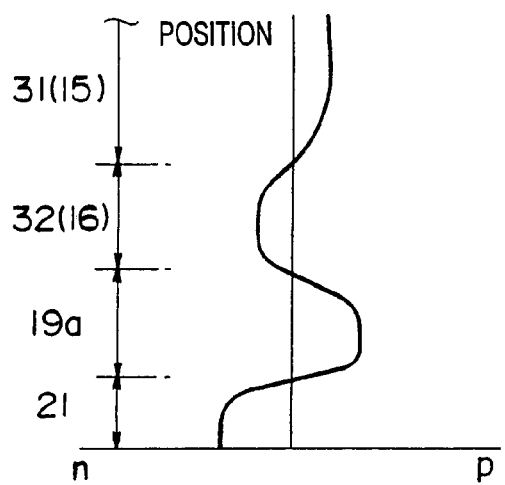 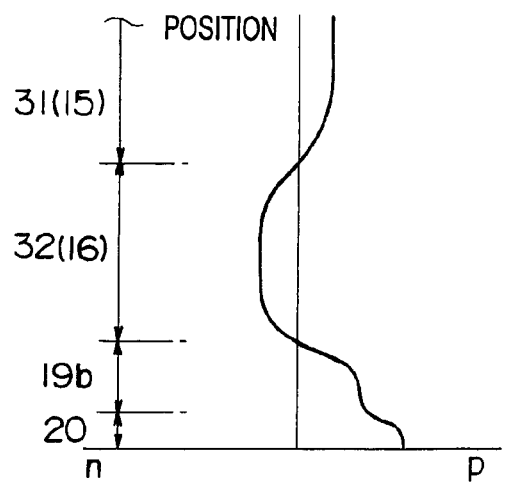

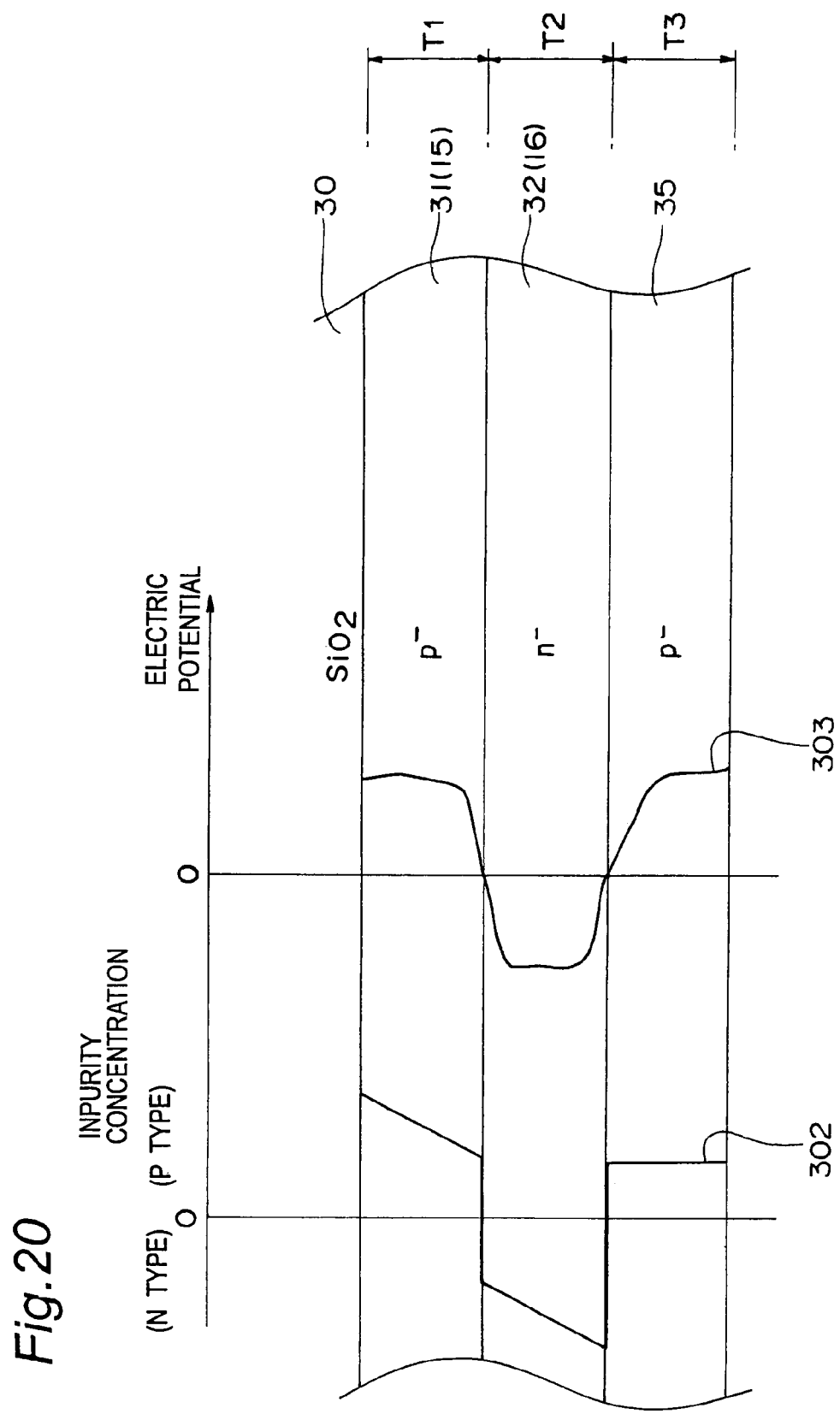

BACK ILLUMINATED IMAGING DEVICE

TECHNICAL FIELD

The present invention relates to back illuminated imaging devices. In particular, the present invention relates to back illuminated imaging devices applied in measurement applications for ultra high speed, ultra high sensitivity imaging in scientific and technical fields such as high speed imaging with a microscope or an electron microscope.

BACKGROUND ART

Back-illuminated imaging devices are known wherein an incident beam such as visible light is irradiated on to a surface (back surface) opposite to a surface (front surface) where electrodes and the like of a chip are arranged (see patent document 1). The back illuminated imaging device is provided with a converting portion for each pixel (for example a photoelectric converting portion if the incident beam is incident light) on the back surface of the chip and on the front surface of the chip is provided a portion (a charge processing portion) that in some manner processes signal charges, examples being an A/D converter and a signal storage portion.

Since the back illuminated imaging device can achieve an aperture ratio of nearly 100%, it is able to offer extremely high sensitivity. Consequently, the back illuminated imaging device is frequently used in applications requiring high sensitivity such as in the fields of astronomy and electron microscopy. Furthermore, back illuminated imaging devices that have high sensitivity are also suited for high speed imaging in which the exposure time for a single image is short.

The present inventors have developed an in-situ storage image sensor (ISIS) provided with linear signal storage portions inside or in the vicinity of pixels (for example, see patent document 2, non-patent document 1, and non-patent document 2). Furthermore, the present inventors have developed a back illuminated imaging device in which a principle of the in-situ storage image sensor is applied (see patent document 3).

FIG. 30 and FIG. 31 show an in-situ storage type back illuminated imaging device. A plurality of pixels 203 are arranged two-dimensionally on an incident surface (back surface) 202 of a back illuminated imaging device 201. For simplification, FIG. 30 shows only 12 (4 lines×3 rows) of the pixels 203, but the number of lines and number of rows of the pixels 203 may be two or more respectively. Furthermore, for simplification, FIG. 30 does not show a photoelectric converting layer 205 and a charge collecting layer 206, which are described later.

As shown in FIG. 31, a p-photoelectric converting layer 205 is provided on the incident surface 202 of a chip 204. And an n-charge collecting layer 206 is provided adjacent to a front surface 208 of the photoelectric converting layer 205. Further still, an n-type input region 209 is provided on the front surface 208 for each of the pixels 203. An n-charge accumulation portion 207 is provided extending from the charge collecting layer 206 to the input region 209 for each of the pixels 203.

A signal storage CCD 211, which extends diagonally downward in FIG. 30, is connected to each of the input regions 209. A CCD (a vertical reading CCD 212) is provided extending in a vertical direction (row direction) in the drawing for each row of the input regions 209. Further still, a drain line 227 is provided adjacent to each of the vertical reading CCDs 212. And further still, a CCD (a horizontal reading CCD 125) is provided extending in a horizontal direction (line direction) in the drawing.

The signal storage CCDs 211 and the vertical reading CCDs 212 are embedded in p-type charge blocking regions 213 that are provided on the front surface of the chip 204. A concentration distribution of p-type impurities in the charge blocking regions 213 is constant. Furthermore, as indicated by symbol T in FIG. 31, the thickness of the charge blocking regions 213 as measured from the front surface 208 of the chip 204 is constant. P+ channel stops 214 are provided between two adjacent signal storage CCDs 211 and between the signal storage CCD 211 and the vertical reading CCD 212. Numeral 215 indicates an electrode for driving the signal storage CCD 211 and numeral 216 indicates an electrode for sending the signal charges from the input region 209 to the signal storage CCD 211.

Electrons (signal charges) produced by the photoelectric converting layer 205, which are caused by irradiation of light onto the incident surface 202 as indicated by arrow A, are moved to the charge collecting layer 206 as indicated by dashed line B. Furthermore, the electrons move horizontally in the charge collecting layer 206 in FIG. 31 and reach the charge accumulation portions 207, then are sent from the input region 209 to the signal storage CCDs 211.

With reference to FIG. 32 also it is evident that the electric potential distribution of the n-charge collecting layer 206 is affected by having the n-type signal storage CCDs 211 and the vertical reading CCDs 21 and the p+ channel stops 214 embedded alternately in the p-type charge blocking regions 213. In more detail, closed regions having low electric potential are produced as indicated by arrow C in FIG. 32. Thus, on dashed line D, where portions having the highest electric potential are linked horizontally (movement direction of electrons), unevenness is produced in the electric potential distribution as shown in FIG. 33. It is necessary for electrons to cross this unevenness in electric potential distribution and move through the charge collecting layer 206. Consequently, due to the unevenness in electric potential distribution, the movement speeds at which the electrons move through the charge collecting layer 206 is lowered. For example, when a gap E in the unevenness of electric potential distribution is 0.3 V or more, some of the electrons become trapped and produce an afterimage when viewed at short time intervals even under room temperature, and therefore the time resolution is reduced. When the diffusion movement speed of the electrons is low, such as in low temperatures, electrons become trapped by unevenness in the electric potential distribution even with lower voltages. Symbol 217 in FIG. 33 conceptually shows electrons trapped in the unevenness of the electric potential distribution. The movement speed of electrons becomes extremely slow by electrons being trapped in the unevenness of the electric potential distribution and therefore afterimages are produced when the time interval between frames is narrowed, thereby reducing the time resolution. Similarly, in high sensitivity imaging where the number of photoelectrons is small such as in the use of electron microscopes, the movement speed of the electrons becomes extremely slow by electrons being trapped in the unevenness of the electric potential distribution and therefore afterimages are produced when the time interval between frames is narrowed, thereby reducing the time resolution.

Due to the presence of unevenness in the electric potential distribution in the charge collecting layer 206, the movement speed of electrons in the charge collecting layer is reduced, which incurs reductions in time resolution, that is, reductions in imaging speed. Consequently, the unevenness in the electric potential distribution in the charge collecting layer 206 presents a serious problem in achieving ultra high sensitivity imaging at ultra high speeds.

[Patent document 1] JP H9-331052 A
[Patent document 2] JP 2001-345441 A
[Patent document 3] JP 2004-235621 A
[Non-patent document 1] Takeharu ETOH et al. "A CCD Image Sensor of 1M frames/s for Continuous Image Capturing of 103 Frames," Digest of Technical Papers, 2002 IEEE International Solid-State Circuits Conference, 2002, Vol. 45, p. 46 to 47
[Non-patent document 2] Takeharu ETOH and four others: "An In-situ Storage Image Sensor of 1M frames/s with Slanted Linear CCD Storage," Journal of the Institute of Image Information and Television Engineers, the Institute of Image Information and Television Engineers, 2002, Vol. 56, No. 3, p. 483 to 486.

DISCLOSURE OF INVENTION

Problem to be Solved by the Invention

The present invention addresses the issues of improving the movement speed of signal charges in charge collecting layers and improving time resolution, that is, improving imaging speed in back illuminated imaging devices provided with CCDs as signal storage portions.

Means for Solving the Problem

In the present description, the term "incident beam" refers to energy or a flow of particles, which are detection targets irradiated onto the imaging device, and covers electromagnetic waves including light such as ultraviolet rays, visible light rays, and infrared rays, flows of charged particles such as electrons, ions, and positive holes, as well as alpha rays, gamma rays, and beta rays in addition to X rays, and radiation including neutron beams.

A first aspect of the present invention provides a back illuminated imaging device that is provided with a first conductive type converting layer provided on a back surface side where an incident beam is irradiated and that converts the incident beam to signal charges, a plurality of second conductive type input regions provided respectively on a front surface side of an opposite side to the back surface for a plurality of pixels configured in a two-dimensional array, a plurality of second conductive type CCD charge transferring paths provided on the front surface side for each of the plurality of input regions and that extend parallel to each other and transfer signal charges from the corresponding input regions, a second conductive type charge collecting layer provided adjacent to the front surface side of the converting layer and that moves the charges produced at the converting layer toward the input regions, a plurality of second conductive type charge accumulation portions that extend from the charge collecting layer to each of the input regions, and a plurality of first conductive type charge blocking regions that are provided on the front surface side and in which the CCD charge transferring paths are embedded and an impurity concentration of a first portion extending along the CCD charge transferring paths is higher than an impurity concentration of a second portion extending along gaps between the adjacent CCD charge transferring paths. When the first conductive type is p, the second conductive type is n. Conversely, the first conductive type may be n and the second conductive type may be p.

By setting the impurity concentrations of the first and second portions of the charge blocking regions in the above-described manner, unevenness in the electric potential distribution in the charge collecting layer can be eliminated or reduced. As a result, the speed at which signal charges produced in the converting layer move through the charge collecting layer is improved, thereby improving the time resolution, that is, the imaging speed.

First conductive type channel stops having an impurity concentration higher than that of the charge blocking regions may be further provided between the adjacent CCD charge transferring paths.

It is preferable that an impurity concentration of the photoelectric converting layer in portions corresponding to the charge blocking regions is higher than an impurity concentration of portions corresponding to the photoelectric converting layer in the input regions.

By setting the impurity concentrations of the photoelectric converting layer in the above-described manner, an electric potential gradient is formed facing the input regions in the charge collecting layer. This also improves the movement speed of signal charges in the charge collecting layer. Alternatively, second conductive type impurities maybe further implanted in a surface of portions corresponding to the charge blocking regions.

A first conductive type impurity doped layer may be further provided in portions corresponding to the charge blocking regions.

Also by providing the impurity doped layer, an electric potential gradient is formed facing the input regions of the charge collecting layer, thereby improving the movement speed of signal charges in the charge collecting layer.

In facing the electric potential gradient toward the input regions, it is preferable that the impurity doped layer is arranged in a row direction of the pixels when viewed from an incidence direction of the incident beam and is constituted by a plurality of portions, each of whose width becomes narrower in the row direction of the pixels facing the input regions.

Alternatively, the impurity doped layer may be band shaped extending in the row direction of the pixels when viewed from an incidence direction of the incident beam.

A second aspect of the present invention provides a back illuminated imaging device that is provided with a first conductive type converting layer provided on a back surface side where an incident beam is irradiated and that converts the incident beam to signal charges, a plurality of second conductive type input regions provided respectively on a front surface side of an opposite side to the back surface for a plurality of pixels configured in a two-dimensional array, a plurality of second conductive type CCD charge transferring paths provided on the front surface side for each of the plurality of input regions and that extend parallel to each other and in which signal charges from the corresponding input regions are moved, a second conductive type charge collecting layer provided adjacent to the front surface side of the converting layer and that moves the charges produced at the converting layer toward the input regions, a plurality of second conductive type charge accumulation portions that extend from the charge collecting layer to each of the input regions, and a plurality of first conductive type charge blocking regions arranged on the front surface side and in which the CCD charge transferring paths are embedded, wherein an impurity concentration of the photoelectric converting layer in portions corresponding to the charge blocking regions is higher than an impurity concentration of the photoelectric converting layer in portions corresponding to the input regions.

A third aspect of the present invention provides a back illuminated imaging device that is provided with a first conductive type converting layer provided on a back surface side where an incident beam is irradiated and that converts the incident beam to signal charges, a plurality of second conductive type input regions provided respectively on a front surface side of an opposite side to the back surface for a plurality of pixels configured in a two-dimensional array, a plurality of second conductive type CCD charge transferring paths provided on the front surface side for each of the plurality of input regions and that extend parallel to each other and in which signal charges from the corresponding input regions are moved, a second conductive type charge collecting layer provided adjacent to the front surface side of the converting layer and that moves the charges produced at the converting layer toward the input regions, a plurality of second conductive type charge accumulation portions that extend from the charge collecting layer to each of the input regions, charge blocking regions arranged on the front surface side and in which the CCD charge transferring paths are embedded, and a first conductive type impurity doped layer arranged in portions corresponding to the charge blocking regions.

EFFECT OF THE INVENTION

The back illuminated imaging device of the present invention improves the speed at which signal charges produced in the converting layer move through the charge collecting layer, thereby enabling the time resolution, that is, the imaging speed, to be improved.

BRIEF DESCRIPTION OF THE DRAWINGS

FIG. 18A is a line graph showing an impurity concentration distribution along a line XVIII-XVIII in FIG. 16.

FIG. 18B is a line graph showing an impurity concentration distribution along a line XVIII'-XVIII' in FIG. 16.

FIG. 20 is a partial cross section schematically showing an electric potential distribution in a thickness direction of the back illuminated imaging device.

DESCRIPTION OF REFERENCE NUMERALS

Figure 1:
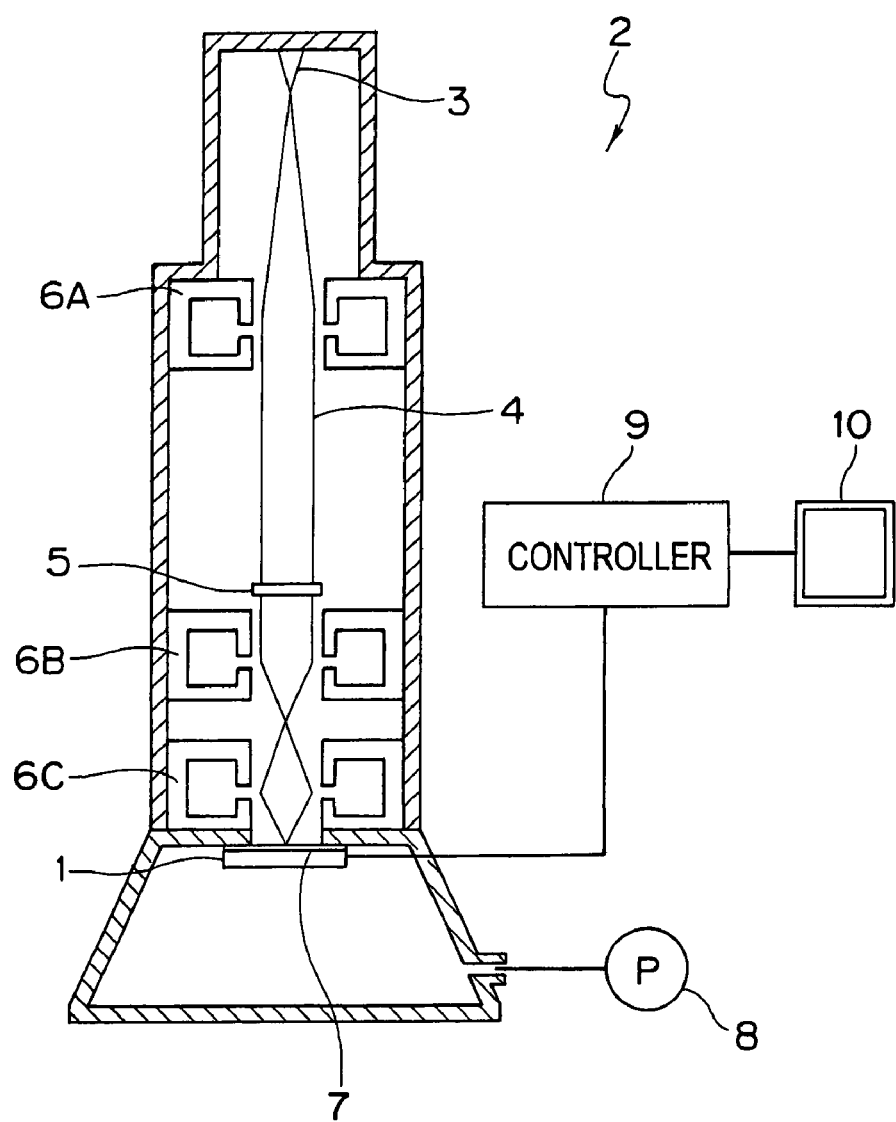
FIG. 1 is a schematic diagram showing a transmission electron microscope provided with a back illuminated imaging device according to a first embodiment of the present invention.

1: in-situ storage type back illuminated imaging device
2: transmission electron microscope
3: electron gun
4: electron stream
5: specimen
6A to 6C: magnetic lens
8: vacuum pump
9: controller
10: display device
11: incident surface
12: front surface
13: pixel
14: chip
15: photoelectric converting layer
16: charge collecting layer
17: input region
18: charge accumulation portion
19: charge blocking regions
19a, 19b: portion
20: channel stop
21: signal storage CCD
22: vertical reading CCD
23: drain line
24: horizontal reading CCD
25: element
26: drain gate
27, 28: electrode
30: substrate
31, 32: epitaxial layer
33: glass
40: impurity doped layer
40a: portion

BEST MODE FOR CARRYING OUT THE INVENTION

Next, embodiments of the present invention are described in detail with reference to the accompanying drawings.

First Embodiment

FIG. 1 shows a transmission electron microscope 2 provided with an in-situ storage type back illuminated imaging device 1 according to a first embodiment of the present invention. In the transmission electron microscope 2, an electron stream 4 (incident beam) is irradiated from an electron gun 3 onto a specimen 5, and the electron stream 4 that has penetrated is focused on a fluorescent surface 7 arranged on a light-receiving surface of the back illuminated imaging device 1. Light that is outgoing from the fluorescent surface 7 is incident on the back illuminated imaging device 1. Numerals 6A to 6C indicate magnetic lenses. The inside of the transmission electron microscope 2 where the electron gun 3, the specimen 5, the back illuminated imaging device 1, and the magnetic lenses 6A to 6C are arranged is maintained at a required degree of vacuum by a vacuum pump 8. Output of the back illuminated imaging device 1 is outputted to a controller 9 as image signals. The controller 9 is provided with various components including a memory and an image processing circuit, and a captured image is output from the controller 9 to a display device 10.

Figure 2:
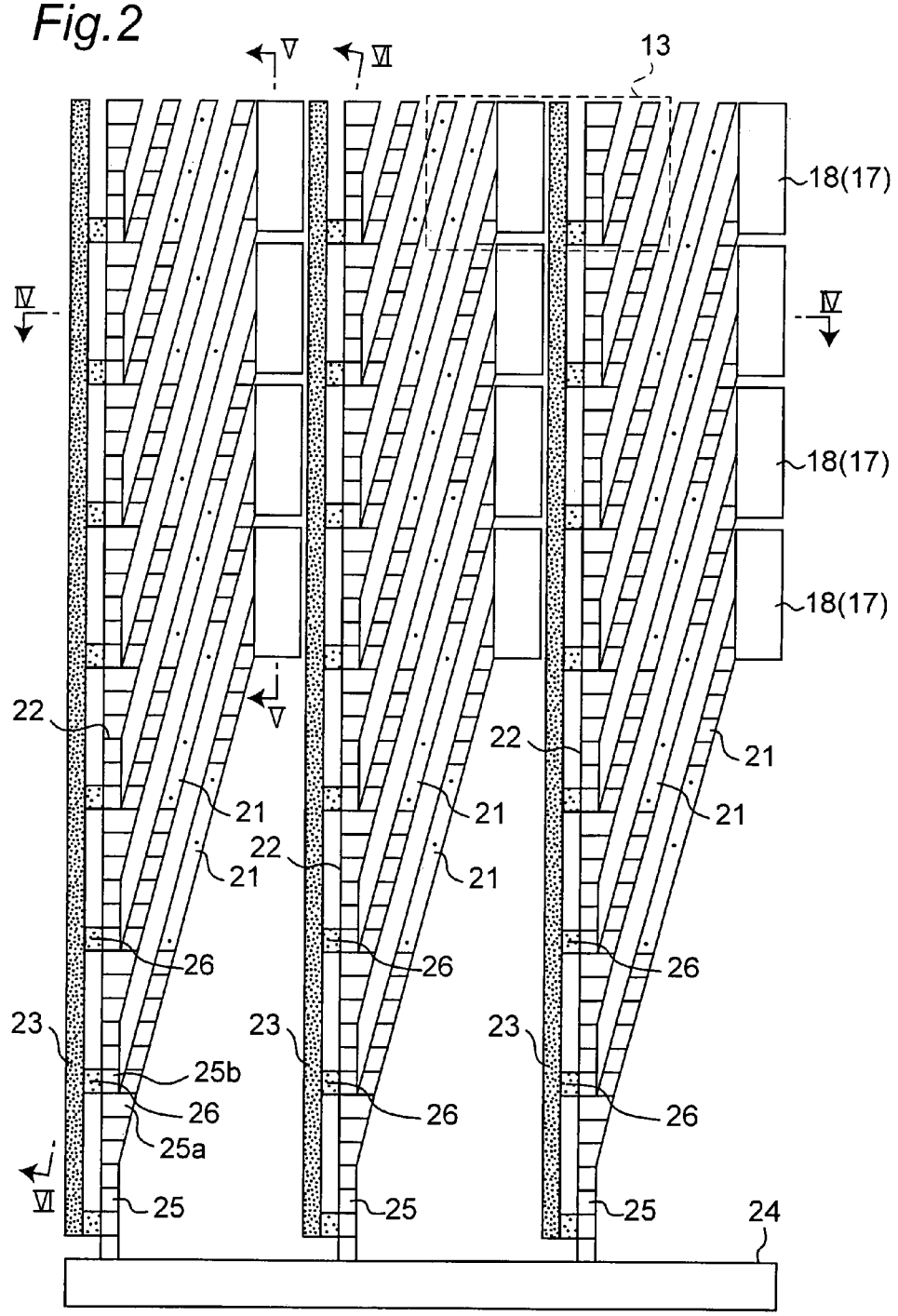
FIG. 2 is a schematic diagram of the back illuminated imaging device according to the first embodiment of the present invention as viewed from an incidence direction (back surface side).

When further referencing FIG. 2 to FIG. 6 it is evident that a plurality of pixels 13 are arranged two-dimensionally on an incident surface (back surface) 11 of the back illuminated imaging device 1. For simplification, FIG. 2 shows only 12 (4 lines×3 rows) of the pixels 13, but the number of lines and number of rows of the pixels 13 may be two or more respectively. Furthermore, FIG. 2 and FIG. 3 do not show a photo electric converting layer 15 and a charge collecting layer 16, which are described later.

Figure 4:
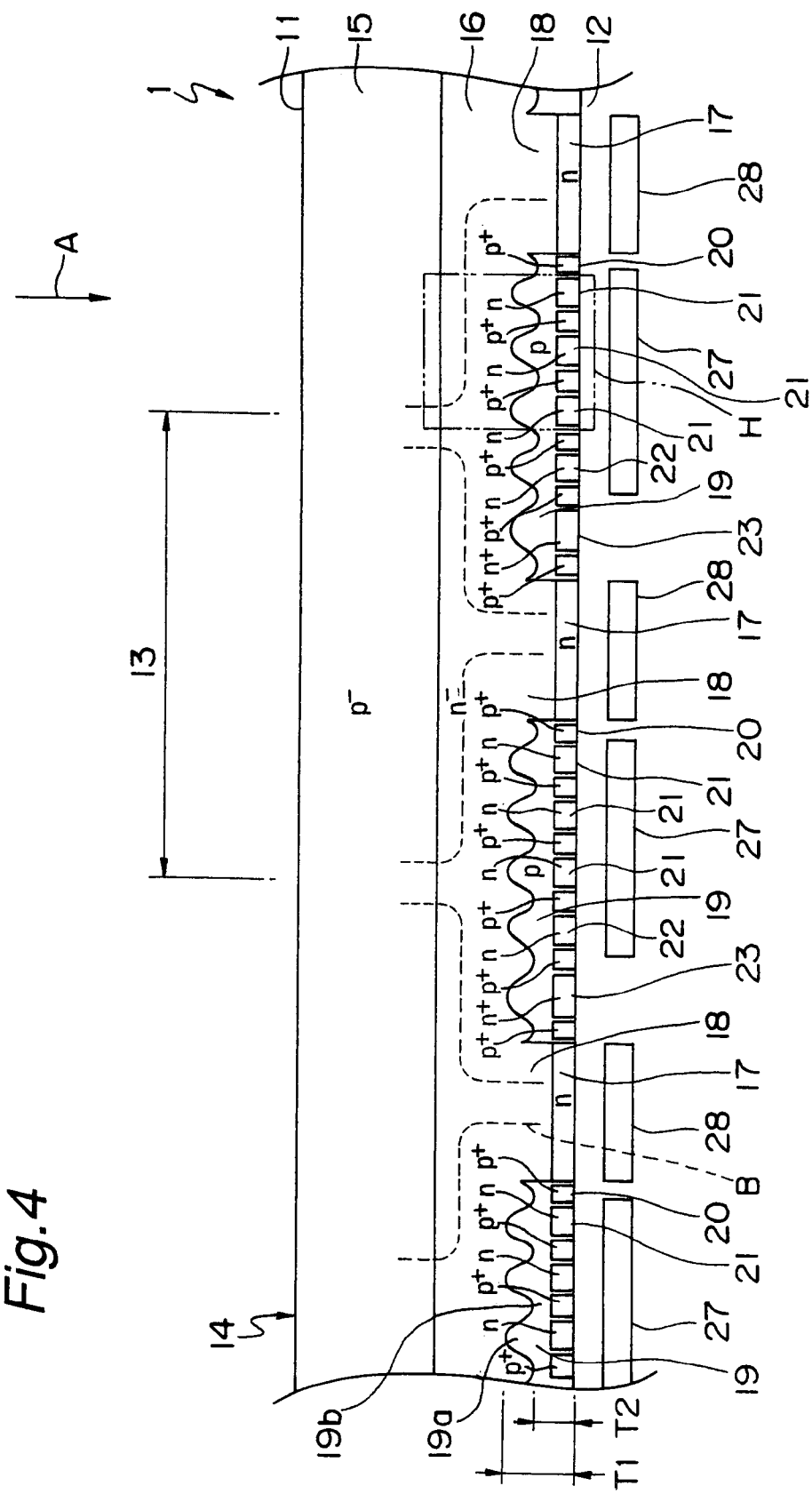
FIG. 4 is a cross sectional view taken along a line IV-IV of FIG. 2.
Figure 5:
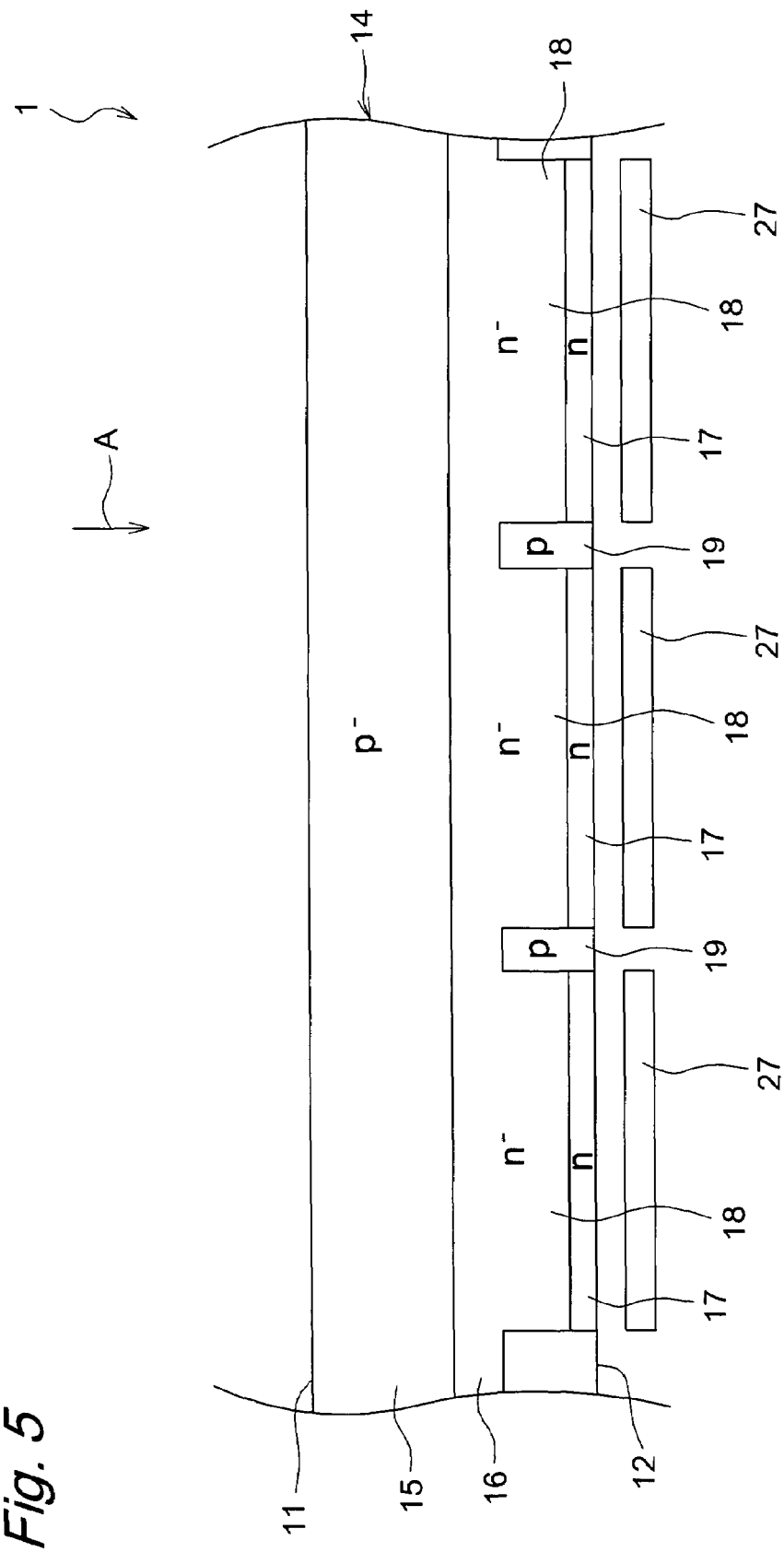
FIG. 5 is a cross sectional view taken along a line V-V of FIG. 2.
Figure 6:
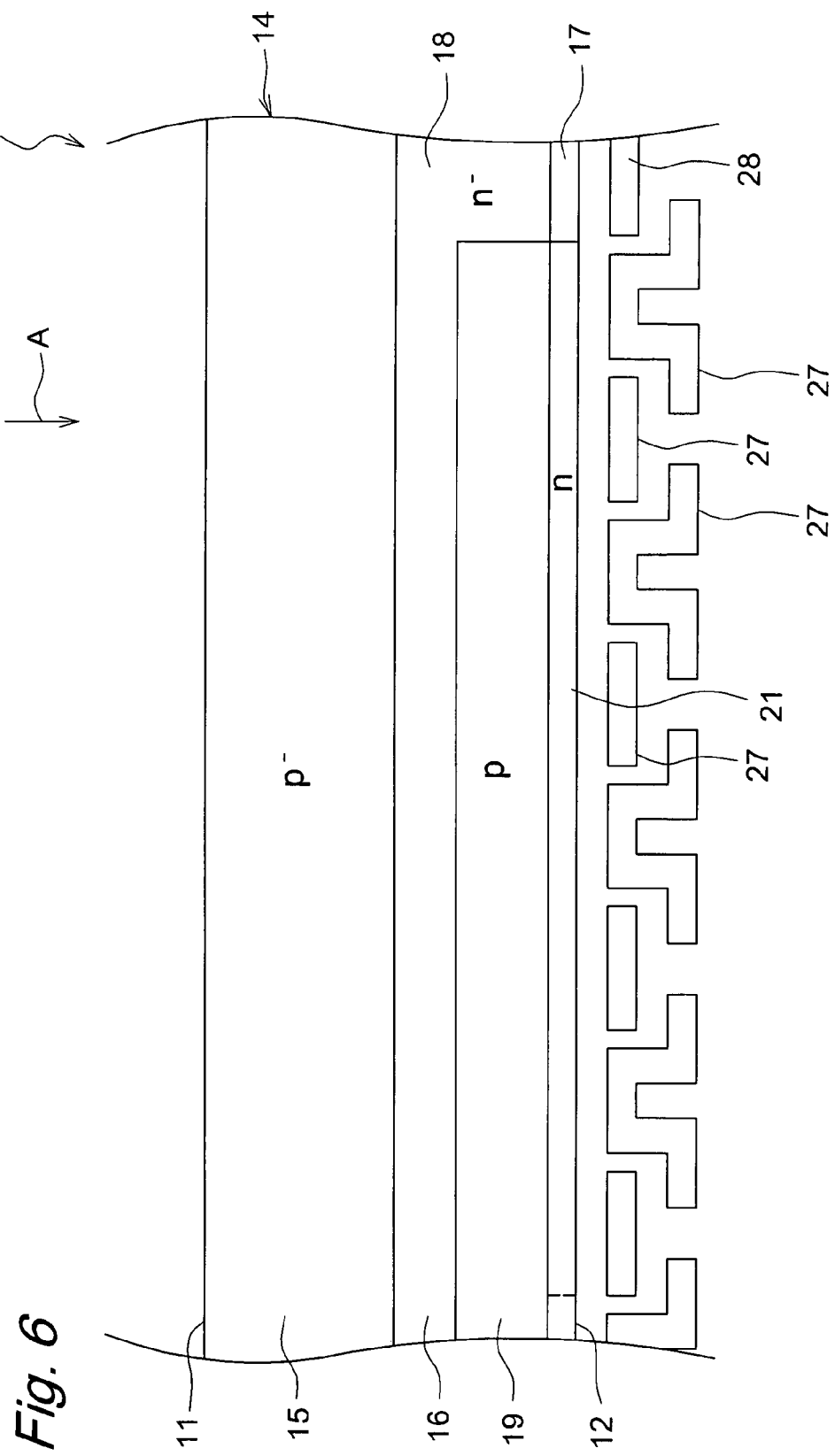
FIG. 6 is a cross sectional view taken along a line VI-VI of FIG. 2.

As shown in FIG. 4 to FIG. 6, a p-photoelectric converting layer 15 is provided on the incident surface 11 of a chip 14. And an n-charge collecting layer 16 is provided adjacent to a front surface 12 of the photoelectric converting layer 15. Further still, an n-type input region 17 is provided on the front surface 12 for each of the pixels 13. And further still, an n-charge accumulation portion 18 is provided extending from the charge collecting layer 16 to the input region 17 for each of the pixels 13.

A signal storage CCD 21, which extends diagonally downward in FIG. 2, is connected to each of the input regions 17. A CCD (a vertical reading CCD) 22 is provided extending in a vertical direction (row direction) in the drawing for each row of the input regions 17. Further still, a drain line 23 is provided adjacent to each of the vertical reading CCDs 22. And further still, a CCD (a horizontal reading CCD 24) 24 is provided extending in a horizontal direction (line direction) in the drawing.

One end of each signal storage CCD 21 is connected to a corresponding input region 17 via an unshown input gate and another end is connected to a vertical reading CCD 22. The other end of the signal storage CCDs 21 having one end connected to the input region 17 constituting a same row merges with the vertical reading CCD 22 corresponding to that row. In other words, all the signal storage CCDs 21 that are connected to the input region 17 constituting the same row merge with the same vertical reading CCD 22. Of the signal storage elements or elements 25 provided in the vertical reading CCDs 22, an element 25b, which is one place upstream from an element 25a that merges with the signal storage CCD 21, is connected to the drain line 23 via a drain gate 26. A lower end of each of the vertical reading CCDs 22 in the drawing is connected to a horizontal reading CCD 24.

Figure 3:
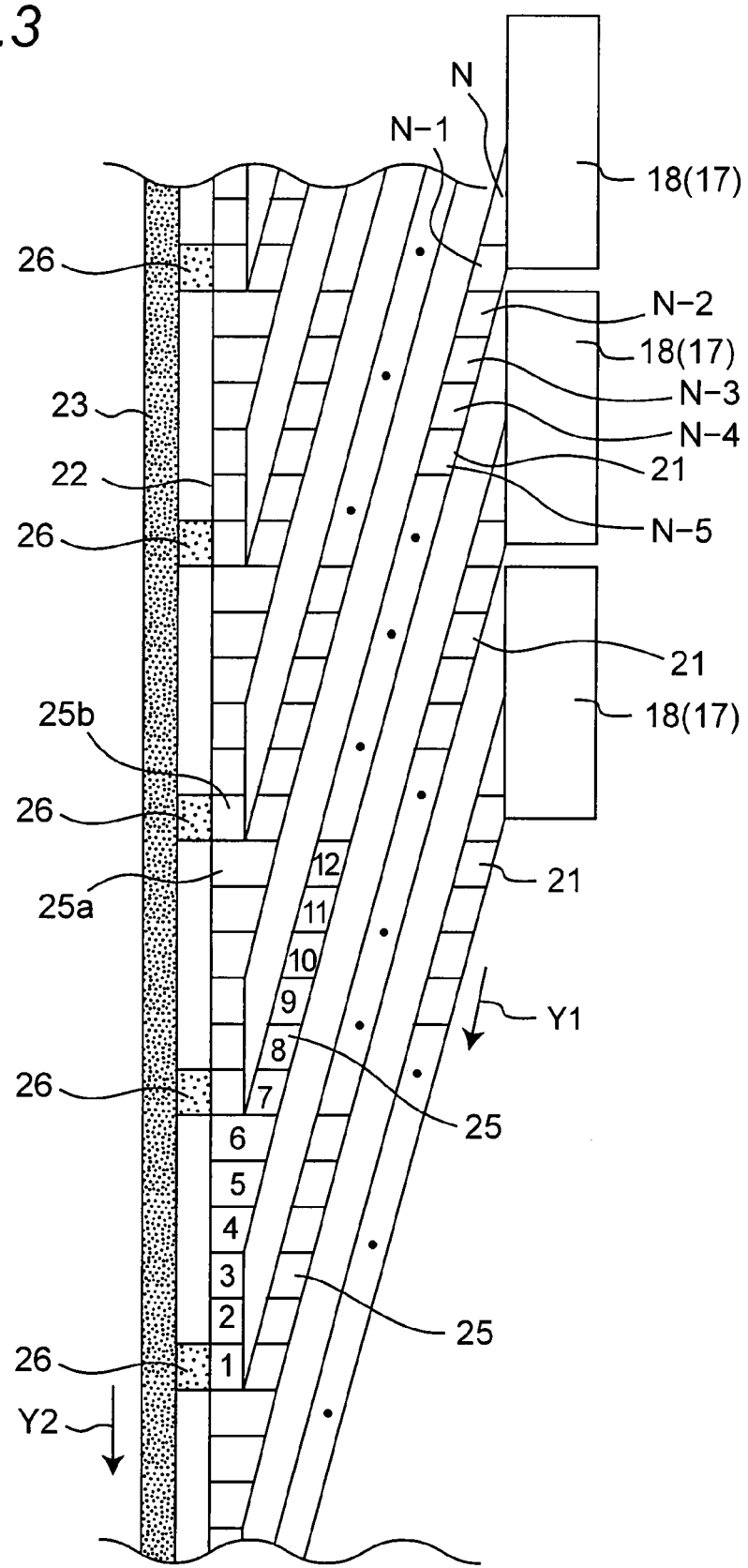
FIG. 3 is an enlargement of a portion of FIG. 2.

During imaging, the back illuminated imaging device 1 executes continuous overwriting. With reference to FIG. 3, during imaging signal charges are successively transferred from the input region 17 to the elements 25 of the signal storage CCD 21 as shown by arrow Y1. Assuming that at a certain moment a signal charge is being stored in each of the elements 25 to which numbers "1" to "N" are given, this indicates that the smaller the number given to the element 25, the older the corresponding image is of the signal charge and that the larger the number given to the element 25, the newer the corresponding image of the signal charge. In the next moment after the state shown in FIG. 3, a signal charge is discharged from the element 25 given the number "1" to the drain line 23 via the drain gate 26 and a signal charge corresponding to the newest N+1 number image is inputted to the element 25 given the number "N" from the input region 17.

And signal charges corresponding to the second to the n-th image are each sent to the element 25 one place downstream. Consequently, signal charges corresponding to images from the second to N+1 are stored in the signal storage CCD 21. During imaging, this continuous overwriting is repeated.

When an occurrence of a phenomenon that is the target of imaging is confirmed, the continuous overwriting is stopped. Generally, an operation of reading out stored signal charges is as follows.

(1) Charge transference at the signal storage CCD 21 is stopped and charge transference is carried out only in the vertical reading CCD 22 as indicated by arrow Y1, then signal charges are sent to the horizontal reading CCD 24. The vertical reading CCD 22 is emptied by this operation.

(2) Charge transference is carried out from the signal storage CCD 21 to the vertical reading CCD 22 and the vertical reading CCD 22 is filled with signal charges.

The signal storage CCDs 21 and the vertical reading CCDs 22 are embedded in p-type charge blocking regions 19 that are provided on the front surface of the chip 14. Furthermore, p+ channel stops 20 are provided between two adjacent signal storage CCDs 21 and between the signal storage CCD 21 and the vertical reading CCD 22. Numeral 27 indicates an electrode for driving the signal storage CCD 21 and numeral 28 indicates an electrode for sending the signal charges from the input region 18 to the signal storage CCD 21.

Concentrations of p-type impurities in the charge blocking regions 19 are different in different areas. Specifically, as expressed by concentrations of diffused dots in FIG. 9B, concentrations of p-type impurities in portions 19a extending along the signal storage CCDs 21 and the vertical reading CCDs 22 of the charge blocking regions 19 are higher than concentrations of p-type impurities in portions (portions extending along the channel stops 20) 19b extending along gaps between adjacent signal storage CCDs 21 and between the signal storage CCDs 21 and the vertical reading CCDs.

Furthermore, a thickness T1 of the portions 19a (portions having high concentrations of p-type impurities) extending along the signal storage CCDs 21 and the vertical reading CCDs 22 of the charge blocking regions 19 is greater than a thickness T2 (portions having low concentrations of p-type impurities) in portions 19b extending along gaps between adjacent signal storage CCDs 21 and between the signal storage CCDs 21 and the vertical reading CCDs. Thus, as clearly indicated in FIG. 4 when viewing a cross section in the line direction of the pixels 13, a border of the charge blocking regions 19 and the charge collecting layer 16 presents a sine wave form or undulation.

A light A that is irradiated from the incident surface 11 reaches the photoelectric converting layer 15 and produces pairs of electrons and positive holes. Of these, the electrons have a negative charge and therefore these move in the n-charge collecting layer 16 as shown by dashed line B in FIG. 4, then further collect in the n-charge accumulation portion 18 by moving horizontally in the charge collecting layer 16, then further accumulate in the n-type input regions 25. The positive holes are consecutively discharged outside the chip 14 through the p-photoelectric converting layer 15. The electrons, that is, the signal charges that have accumulated in the input regions 17 are sent to the signal storage CCDs 21 as described earlier.

Figure 7:
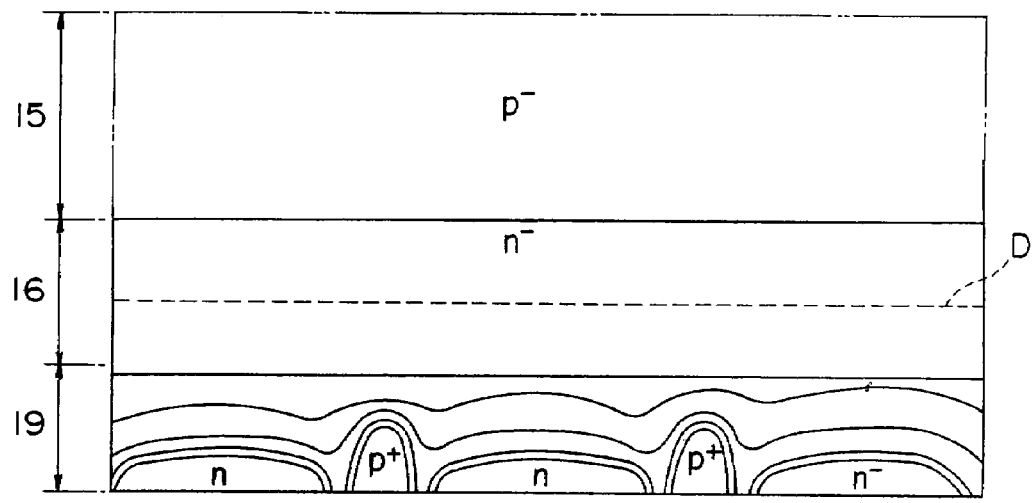
FIG. 7 shows an electric potential distribution of a portion H of FIG. 4.
Figure 8:
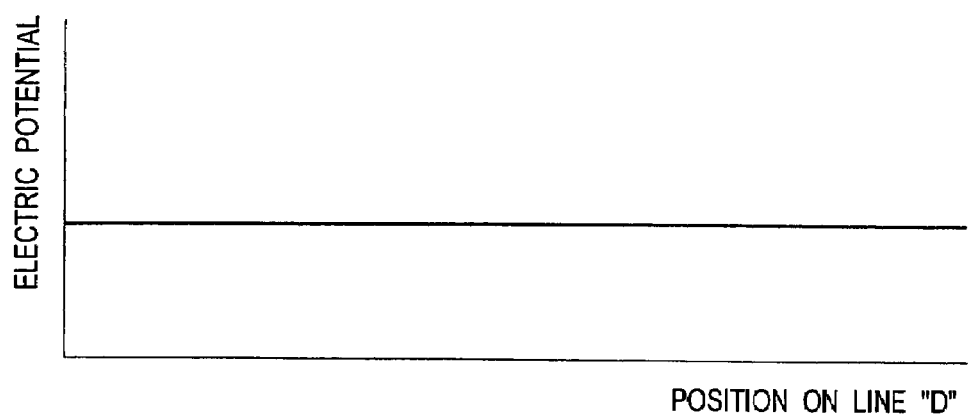
FIG. 8 is a line graph showing the electric potential distribution along a line C of FIG. 7.
Figure 32:
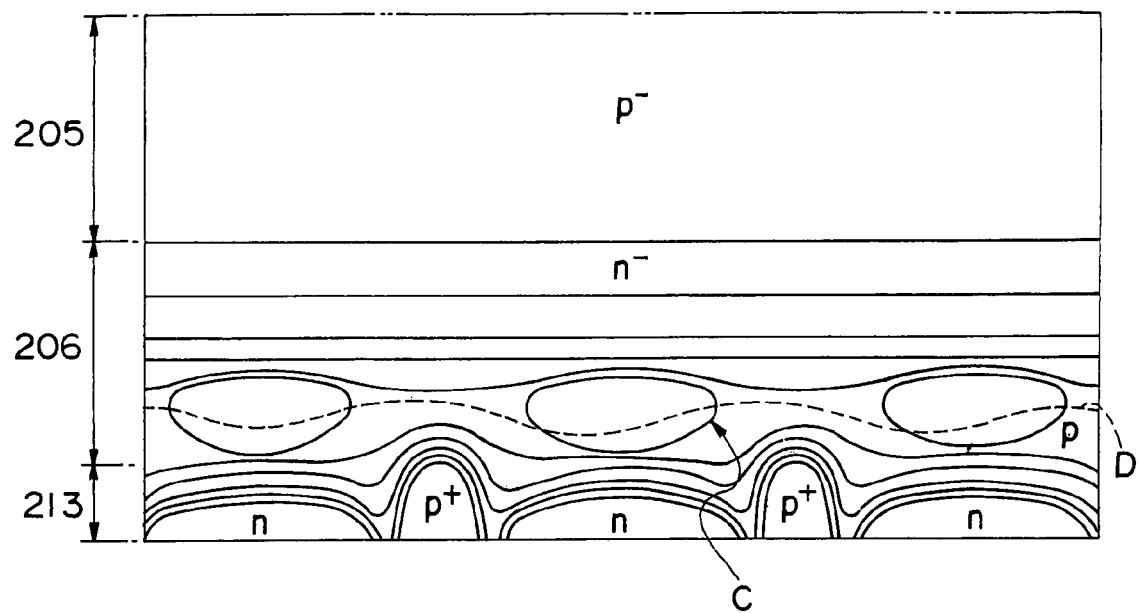
FIG. 32 shows the electric potential distribution E of FIG. 31.
Figure 33:
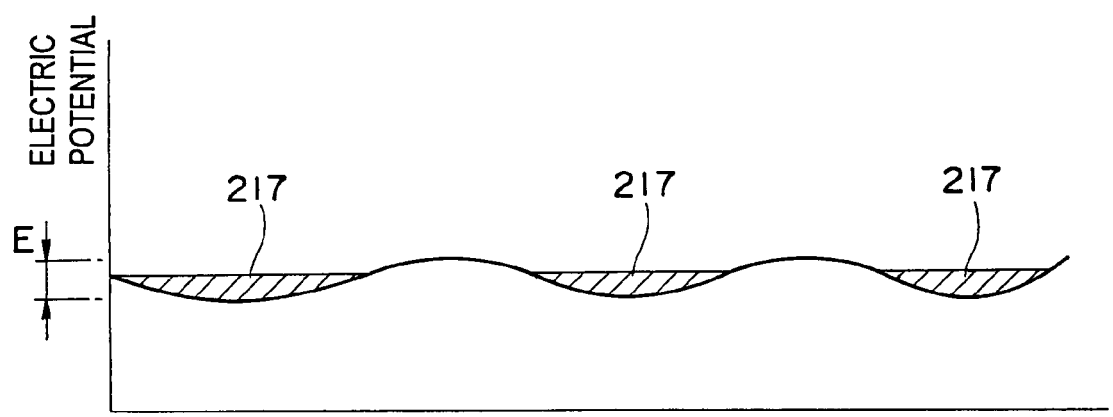
FIG. 33 shows the electric potential distribution along a line C of FIG. 32.

By setting the concentrations of p-type impurities in the portions 19a corresponding to the signal storage and vertical reading CCDs 21 and 22 of the charge blocking regions 19 and the portions 19b corresponding to the channel stops 20 as described above, the charge distribution in the n-charge collecting layer 16 becomes substantially constant as shown in FIG. 7. Specifically, the electric potential along a central line D of the charge collecting layer 16 shown in FIG. 7 becomes substantially level as shown in FIG. 8. In other words, by setting the concentrations of p-type impurities in the charge blocking regions 19 as described above, unevenness in the charge distribution (see FIG. 32 and FIG. 33) is eliminated or reduced. Consequently, the movement speed of electrons when moving through the charge collecting layer 16 is increased. The present embodiment involves use in a transmission electron microscope and therefore the number of photoelectrons is small compared to ordinary imaging, but by improving the movement speed of electrons, occurrences of afterimages can be prevented or suppressed when shortening the time interval between frames. Furthermore, in cases where the diffusion movement speed of electrons is low such as in low temperatures, entrapment of electrons (see symbol 217 in FIG. 33) does not occur.

Figure 9A:
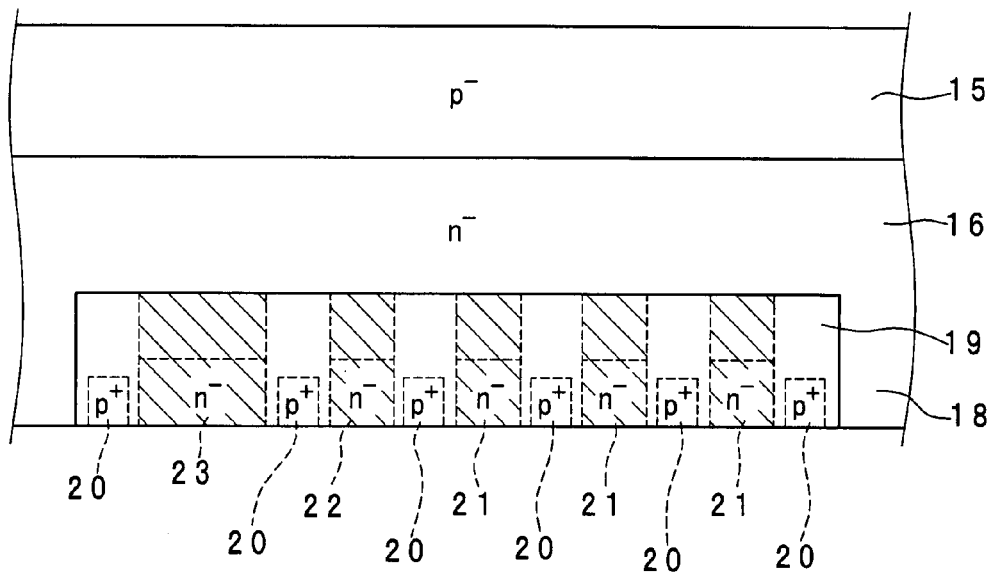
FIG. 9A is a partial cross section showing second time implanting of p-type impurities into charge blocking regions.
Figure 9B:
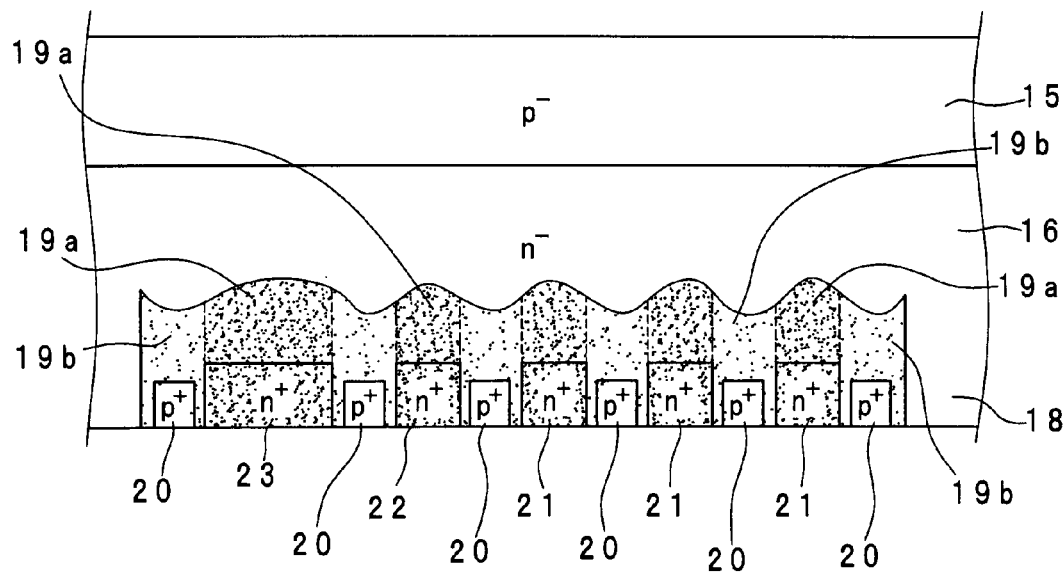
FIG. 9B is a partial cross section showing a state after p-type impurities have been implanted a second time.

Next, a method for manufacturing the back illuminated imaging device 1 of the present embodiment is described. With reference to FIG. 9A, in portions (portions corresponding to n-type regions) corresponding to the signal storage CCDs 21, the vertical reading CCDs 22, and the drain line 23 of the charge blocking layer 19 as indicated under diagonal lines, p-type impurities are further doped and diffused into the p-type layer. As a result, as is expressed by the density of diffused dots in FIG. 9B, the concentration of p-type impurities in the portions 19a corresponding to the signal storage CCDs 21, the vertical reading CCDs 22, and the drain line 23 of the charge blocking layer 19 is higher than the concentration of p-type impurities in the portions (portions corresponding top-type regions) 19b corresponding to the channel stops 20.

Figure 10A:
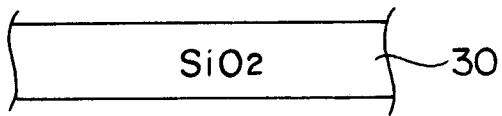
FIG. 10A is a schematic diagram for describing a method for manufacturing a back illuminated imaging device according to a first embodiment.
Figure 10B:
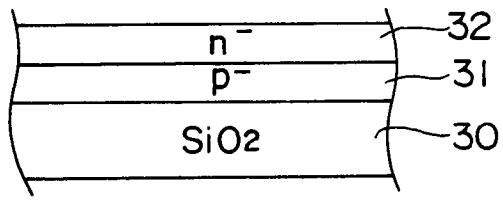
FIG. 10B is a schematic diagram for describing a method for manufacturing the back illuminated imaging device according to the first embodiment.
Figure 10C:
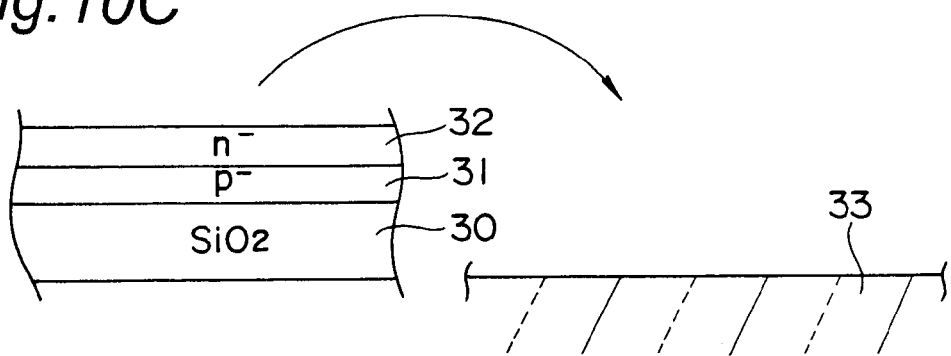
FIG. 10C is a schematic diagram for describing a method for manufacturing the back illuminated imaging device according to the first embodiment.
Figure 10D:
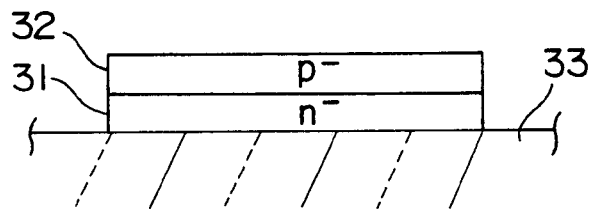
FIG. 10D is a schematic diagram for describing a method for manufacturing the back illuminated imaging device according to the first embodiment.

With reference to FIG. 10, first a silicon substrate 30 is prepared as shown in FIG. 10A, then p- and n-epitaxial layers 31 and 32 are formed on the substrate 30 as shown in FIG. 10B. The p-epitaxial layer 31 corresponds to the photoelectric converting layer 15 and the n-epitaxial layer 32 corresponds to the charge collecting layer 16. Furthermore, the input regions 17, the charge accumulation portions 18, the charge blocking regions 19, the signal storage CCDs 21, and the vertical reading CCDs 22 and the like are formed on the n-epitaxial layer 32 as is described in detail later. Electrodes 27 and 28 are also formed. Next, as shown in FIG. 10C, the n-epitaxial layer 32 is affixed to a glass substrate 33. Electrodes and the like for connecting to external circuits are formed in advance on the glass substrate 33. Finally, as shown in FIG. 10D, the silicon substrate 30 is subjected to grinding to expose the p-epitaxial layer 31.

With reference to FIG. 11 to FIG. 16, further description is given concerning processing after formation of the epitaxial layers 31 and 32. Furthermore, FIG. 17A to FIG. 18B are line graphs that conceptually show distributions of impurity concentrations. In these line graphs, the vertical axis indicates a thickness direction position (assuming the front surface 12 of FIG. 4 as a starting point) and the horizontal axis indicates the impurity concentration. To facilitate understanding, the vertical direction orientation of FIG. 11 to FIG. 16 is aligned with FIG. 4 to FIG. 6.

Figure 11:
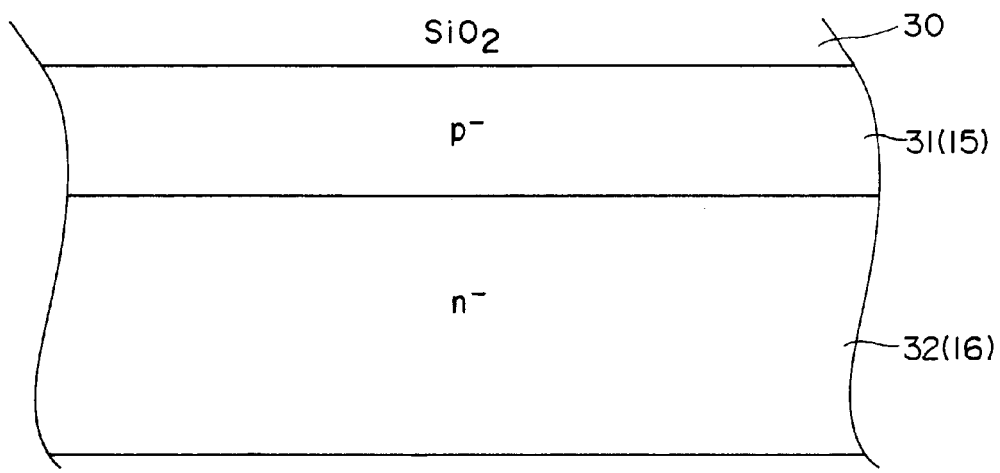
FIG. 11 is a partial cross section for describing a method for manufacturing the back illuminated imaging device according to the first embodiment.
Figure 12:
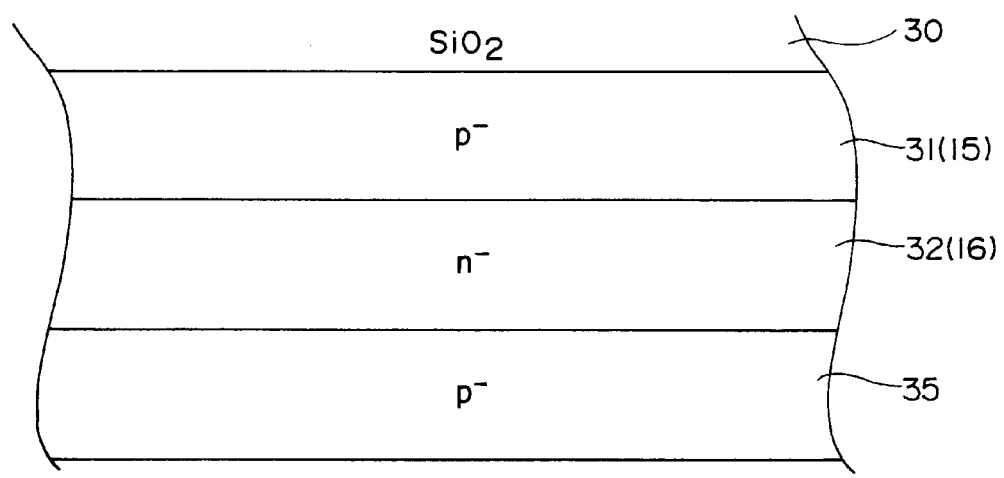
FIG. 12 is a partial cross section for describing a method for manufacturing the back illuminated imaging device according to the first embodiment.
Figure 17A:
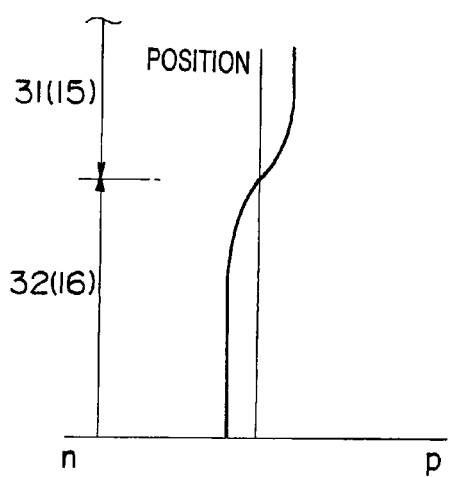
FIG. 17A is a line graph showing an impurity concentration distribution in a thickness direction in FIG. 11.
Figure 17B:
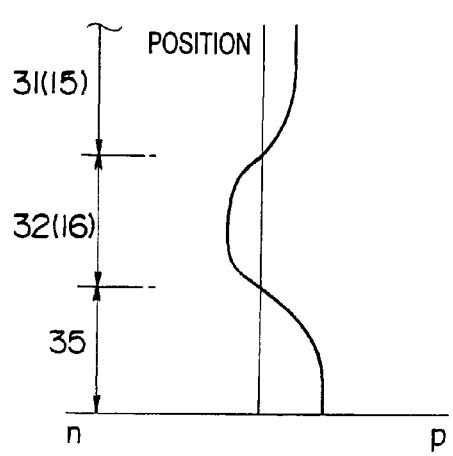
FIG. 17B is a line graph showing an impurity concentration distribution in a thickness direction in FIG. 12.

First, the epitaxial layers 31 and 32 are formed as shown in FIG. 11 and FIG. 17A. Next, p-type impurities are implanted into the n-epitaxial layer 32 by ion doping, thereby forming a p-type region 35 (first implanting of p-type impurities) as shown in FIG. 12 and FIG. 17B. At this stage, portions where the p-type region 35 has not been formed in regard to the entire thickness direction of the epitaxial layer 32 become the charge accumulation portions 18, and n-type impurities are implanted into these portions to form the input regions 17.

Figure 13:
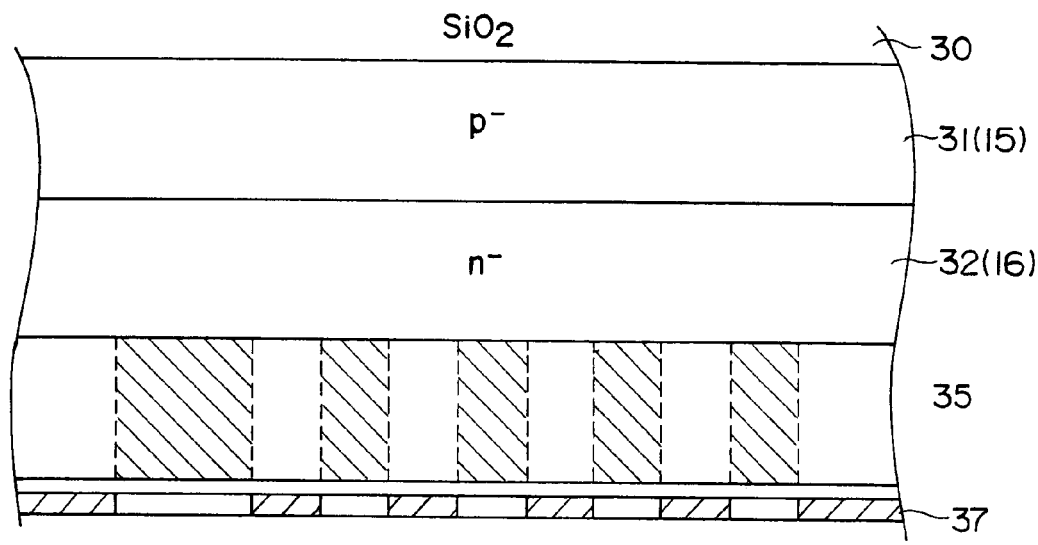
FIG. 13 is a partial cross section for describing a method for manufacturing the back illuminated imaging device according to the first embodiment.
Figure 14:
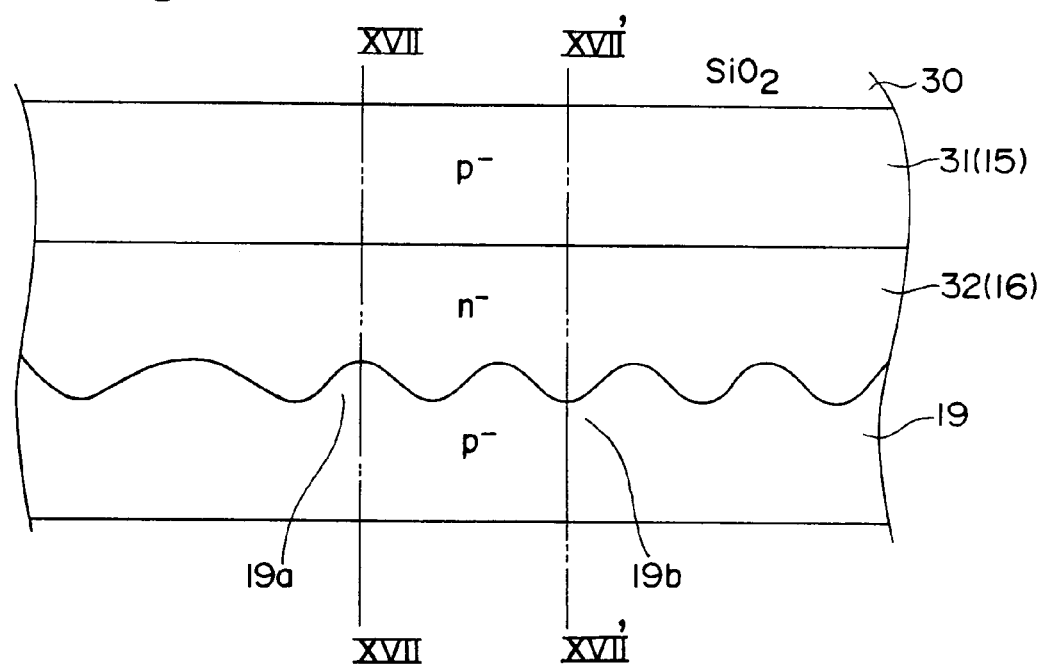
FIG. 14 is a partial cross section for describing a method for manufacturing the back illuminated imaging device according to the first embodiment.
Figure 17C:
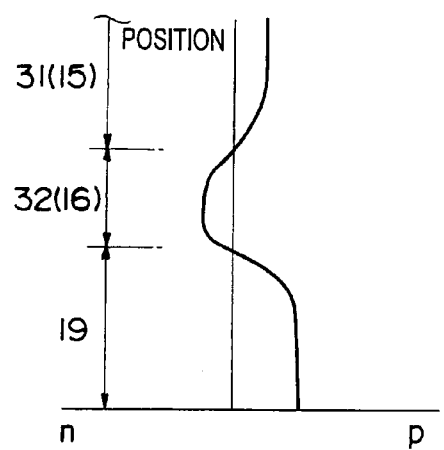
FIG. 17C is a line graph showing an impurity concentration distribution along a line XVII-XVII in FIG. 14.
Figure 17D:
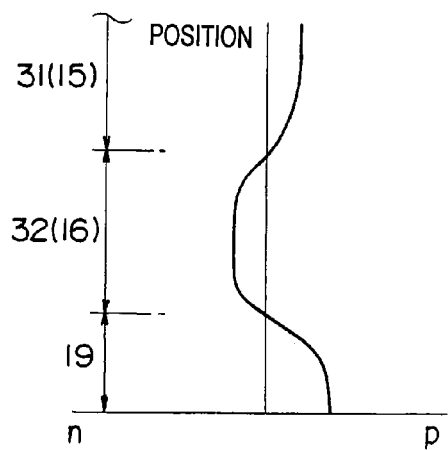
FIG. 17D is a line graph showing an impurity concentration distribution along a line XVII'-XVII' in FIG. 14.

Next, as shown in FIG. 13 and FIG. 9A, p-type impurities are selectively implanted into the p-type region 35 (second implanting of p-type impurities). Specifically, a mask is used as shown schematically by symbol 37 in FIG. 13 and p-type impurities are introduced to portions (portions that will become the portions 19a) corresponding to the signal storage CCDs 21, the vertical reading CCDs, and the drain line 23, which are formed in later processing, and p-type impurities are not introduced into regions (regions that will become the regions 19b) corresponding to the channel stops 20, which are formed in later processing. By diffusing p-type impurities, the charge element regions 19 are formed such that the concentration of p-type impurities in the portions 19a is higher than the concentration of p-type impurities in the portions 19b. A border of the charge collecting layer 16 and the charge blocking regions 19 becomes a sine wave form or undulated. FIG. 17C and FIG. 17D clearly indicate that the thickness of the charge blocking regions 19 as measured from the front surface 12 are different (that the concentrations of p-type impurities in the portions 19a and the portions 19b are different) in the portions 19a (corresponding to the signal storage CCDs 21, the vertical reading CCDs 22, and the drain line 23) and the portions 19b (corresponding to the channel stops 20).

Figure 15:
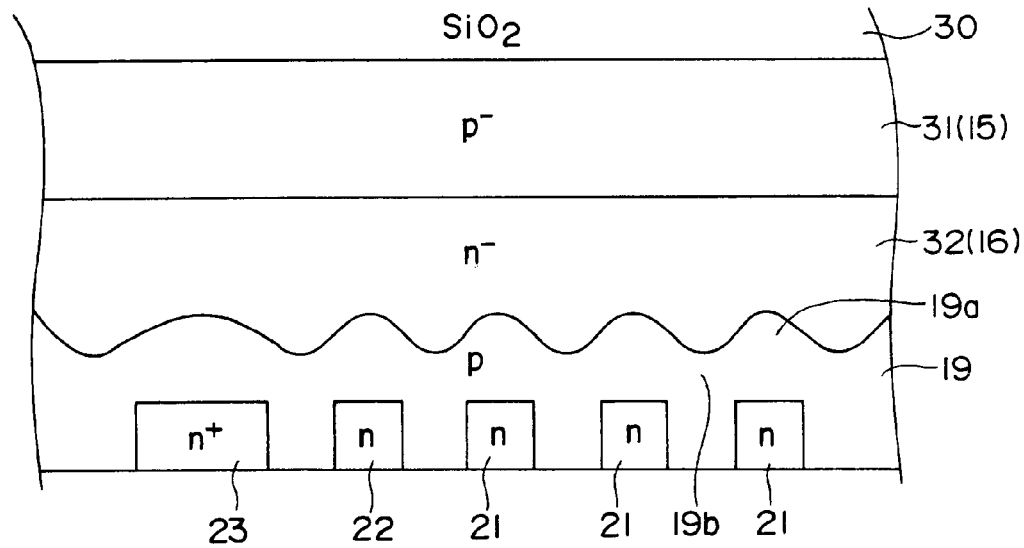
FIG. 15 is a partial cross section for describing a method for manufacturing the back illuminated imaging device according to the first embodiment.
Figure 16:
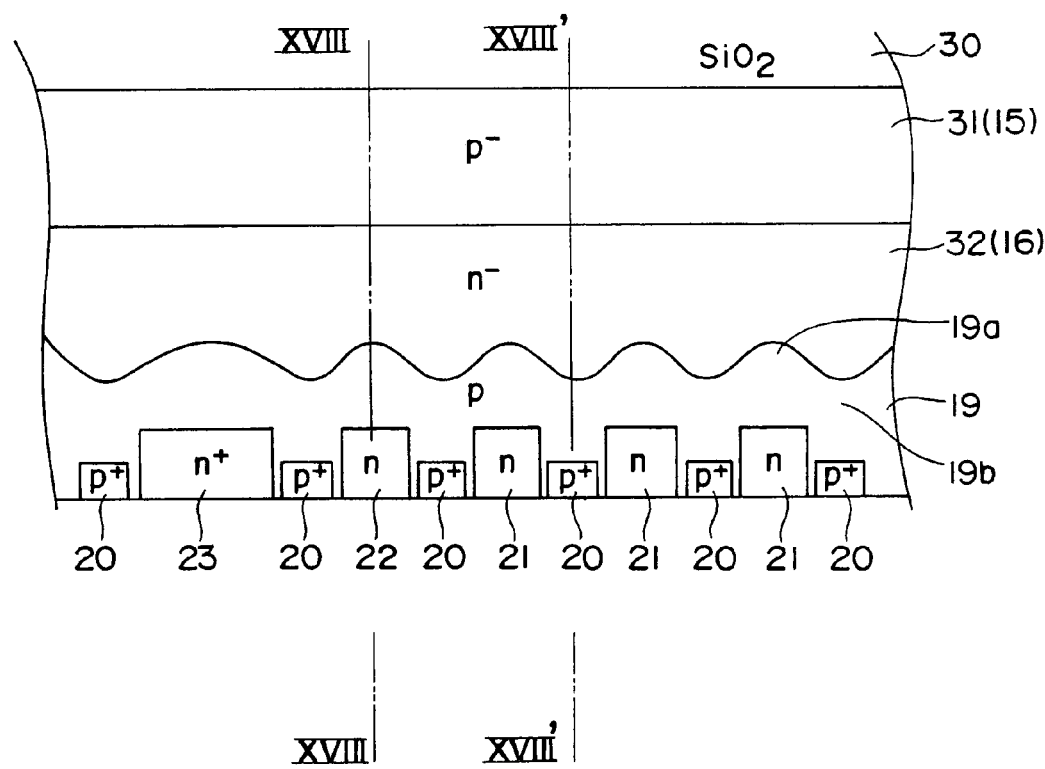
FIG. 16 is a partial cross section showing the back illuminated imaging device according to the first embodiment at a time of completion.

Next, as shown in FIG. 15, n-type impurities are implanted into the portions 19a of the charge blocking regions 19 by ion doping, thereby forming the signal storage CCDs 21, the vertical reading CCDs 22, and the drain line 23. Further still, as shown in FIG. 16, p+ impurities are introduced into the portions 19a of the charge blocking regions 19 to form the channel stops 20. FIG. 18A and FIG. 18B clearly indicate that the distributions of impurity concentrations and the thicknesses of the charge blocking regions 19 are different (that the concentrations of p-type impurities in the portions 19a and the portions 19b are different) in the portions 19a corresponding to the signal storage CCDs 21 of the charge blocking regions 19 and the portions 19b corresponding to the channel stops 20.

Figure 19A:
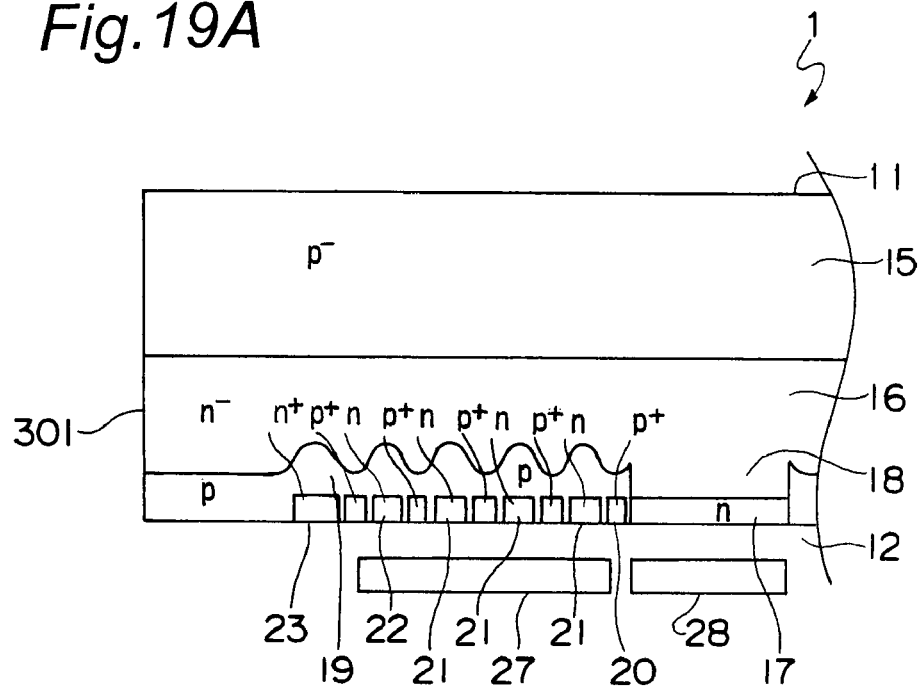
FIG. 19A is a partial cross section of the back illuminated imaging device when processing is not conducted on a cut surface of the device.

The foregoing was a description of a method for manufacturing the back illuminated imaging device 1 of the present embodiment with focus on a single device. To achieve mass production, it is necessary to form a plurality of the back illuminated imaging devices 1 on a single silicon substrate 30 then perform dicing on the silicon substrate 30 and the semiconductor layer formed thereon and obtain individual devices. FIG. 19A shows one of the back illuminated imaging devices 1 after cutting. As is evident by referencing FIG. 19A, at a cut surface 302, the p-photoelectric converting layer 15, then type charge collecting layer 16, and the p-type charge blocking region 19 are lined up in order from the incident surface (back surface) 11. The p-n-p conductive arrangement at the cut surface 302 is a cause of undesirable behavior of the electrons and positive holes in the back illuminated imaging device 1.

Figure 19B:
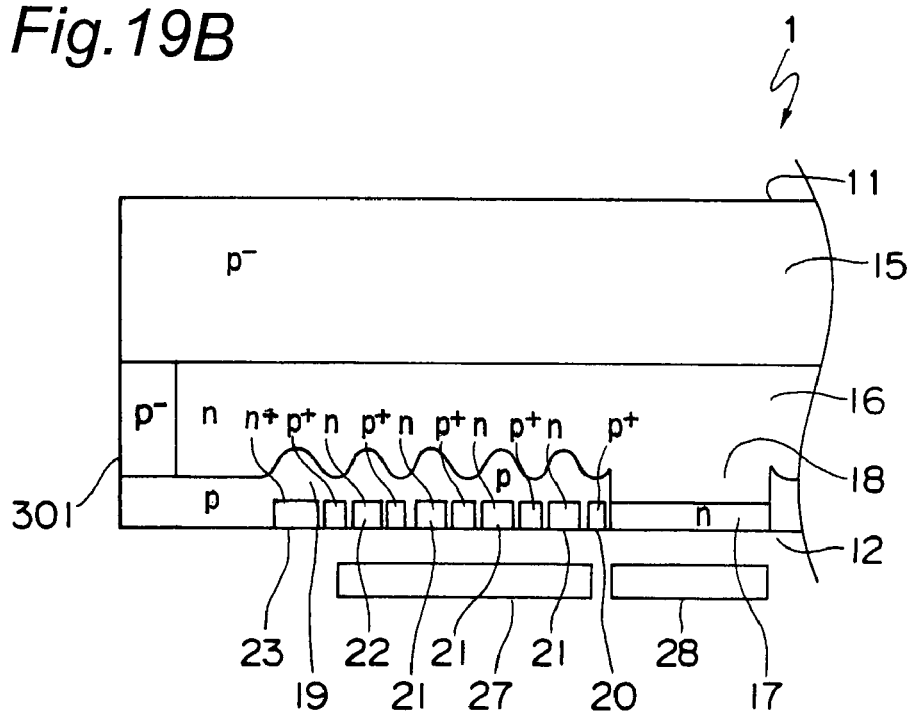
FIG. 19B is a partial cross section of the back illuminated imaging device when p-type impurities are doped into the cut surface of the device.

Accordingly, as shown in FIG. 19B, it is preferable that doping and diffusion of p-type impurities into a portion of the charge collecting layer 16 (n-type) of the cut surface 302 is conducted after dicing so that the conductive type of this portion is set to p-. By doing this, the conductive type of the cut surface 302 becomes entirely p-type from the incident surface (back surface) 11 to the front surface 12, and therefore the above-mentioned undesirable behavior of the electrons and positive holes can be stopped or suppressed. It should be noted that portions corresponding to the cut surface 302 of the n-epitaxial layer 32 (see FIG. 11 to FIG. 16) may be provided in advance with a region having a p-conductive type.

As described with reference to FIG. 12, the p- and n-epitaxial layers 31 and 32 are formed on the silicon substrate 30, then p-type impurities are further implanted into the n-epitaxial layer 32 by ion doping to form the p-type region 35. However, due to diffusion of impurities between the epitaxial layer 31 and the epitaxial layer 32, the border between the epitaxial layers 31 and 32 becomes indistinct. Specifically, the electric potential of the epitaxial layer 31 (intended to be p-) near the border has a tendency toward the negative side due to penetration of n-type impurities from the epitaxial layer 32. Similarly, due to diffusion of impurities between the epitaxial layer 32 and the region 35, the border therebetween becomes indistinct. Specifically, the electric potential of the epitaxial layer 32 (intended to be n-) near the border has a tendency toward the positive side due to penetration of p-type impurities from the region 35. Furthermore, the epitaxial layer 32 and the region 35 are extremely thin compared to the epitaxial layer 31. For example, when the thickness T1 of the epitaxial layer 31 is approximately 50 um, the thickness T2 of the epitaxial 32 and a thickness T3 of the region 35 are no more than approximately 5 μm respectively. Due to this disparity in thicknesses, an influence of the diffusion of impurities is more outstanding. As mentioned above, the p-epitaxial layer 31, the n-epitaxial layer 32, and the p-type region 35 become the photoelectric converting layer 15, the charge collecting layer 16, and the charge blocking regions 19 respectively, and therefore when the borders between these indistinct, this becomes a cause of an undesirable behavior of the electrons and the positive holes inside the back illuminated imaging device 1.

Accordingly, as shown schematically by line 302 in FIG. 20, it is preferable that the impurity concentrations of the epitaxial layers 31 and 32 are made to have a thickness direction distribution. Specifically, in the epitaxial layer 31, the concentration of p-type impurities is gradually increased from the silicon substrate 30 side (back surface 11 side) toward the front surface 12 side. Furthermore, in the epitaxial layer 32, the concentration of n-type impurities is gradually increased from the region 35 side (back surface 11 side) toward the front surface 12 side. By setting the impurity concentration distributions in this manner, the above-mentioned influence of diffusion of impurities is canceled out and, as shown by line 302 in FIG. 20, the border between the epitaxial layers 31 and 32 and the border between the epitaxial layer 32 and the region 35 become distinct.

Second Embodiment

Figure 21:
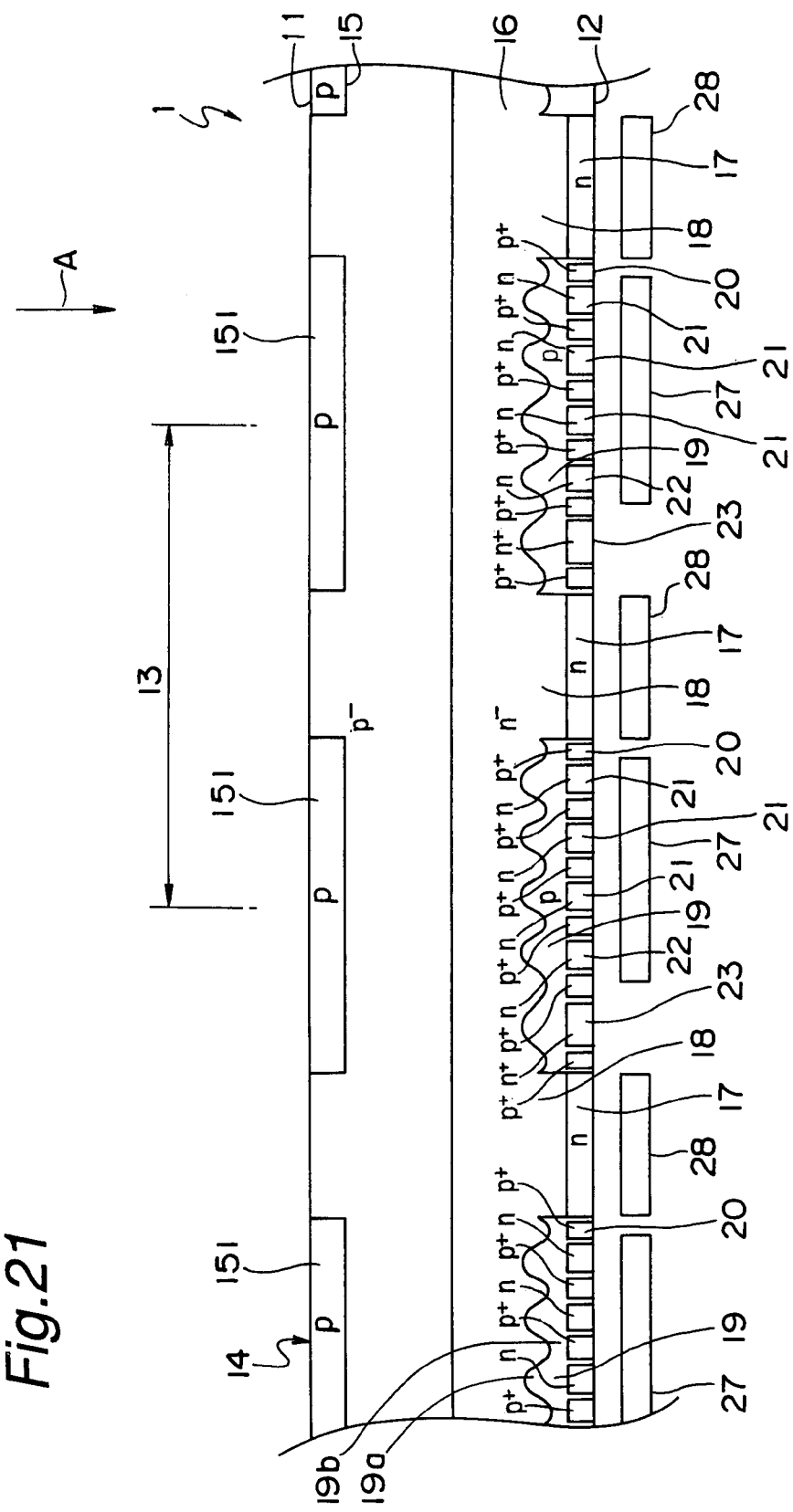
FIG. 21 is across section showing a back illuminated imaging device according to a second embodiment.

FIG. 21 is a shows a back illuminated imaging device 1 according to a second embodiment of the present invention. In a vicinity of the incident surface 11, p-type regions 151 are provided in portions corresponding to the charge blocking regions 19 of the p-photoelectric converting layer 15. By providing these p-type regions 151, an electric potential gradient is formed facing the input regions 17 of the charge collecting layer 16.

To form the p-type region 151, the epitaxial layers 31 and 32 (see FIG. 11) are formed on the substrate 30 (see FIG. 10), after which p-type impurities are implanted by ion doping from the incident surface 11 to regions (regions in which the charge blocking regions 19 are formed in a later process) corresponding to the charge blocking regions 19 of the epitaxial layer 31. Other structures and effects of the second embodiment are the same as the first embodiment.

Figure 22:
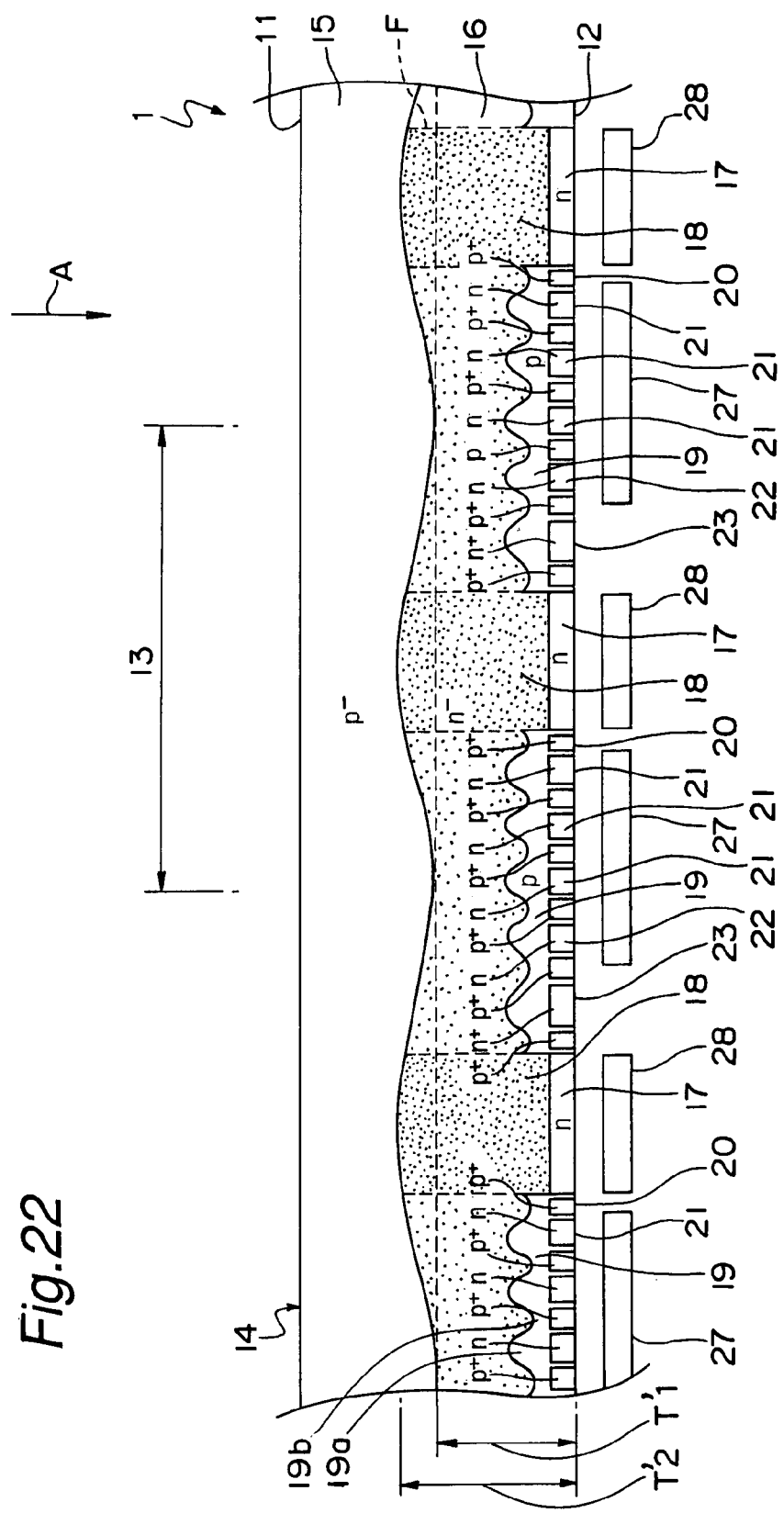
FIG. 22 is across section showing a back illuminated imaging device according to a modified example of the second embodiment.

FIG. 22 shows a modified example of the second embodiment. After the epitaxial layers 31 and 32 (see FIG. 11) are formed on the substrate 30 (see FIG. 10), n-type impurities are implanted by ion doping from the front surface 12 to regions (regions in which the charge accumulation portions 18 and the input regions 17 are formed in a later process) corresponding to the charge accumulation portions 18 and the input regions 17 of the epitaxial layer 32, then diffusion is carried out by thermal diffusion or the like. A result thereof is that, as expressed by the density of diffused dots, the concentration of n-type impurities of portions corresponding to the input regions 17 of the charge collecting layer 16 becomes higher than the concentration of n-type impurities of portions corresponding to the charge blocking regions 19 of the charge collecting layer 16. In FIG. 22, dashed line F indicates a border of the photoelectric converting layer 15 (epitaxial layer 31) and the charge collecting layer 16 (epitaxial layer 32) when implanting of n-type impurities into the epitaxial layer 32 has not been carried out.

Third Embodiment

Figure 23:
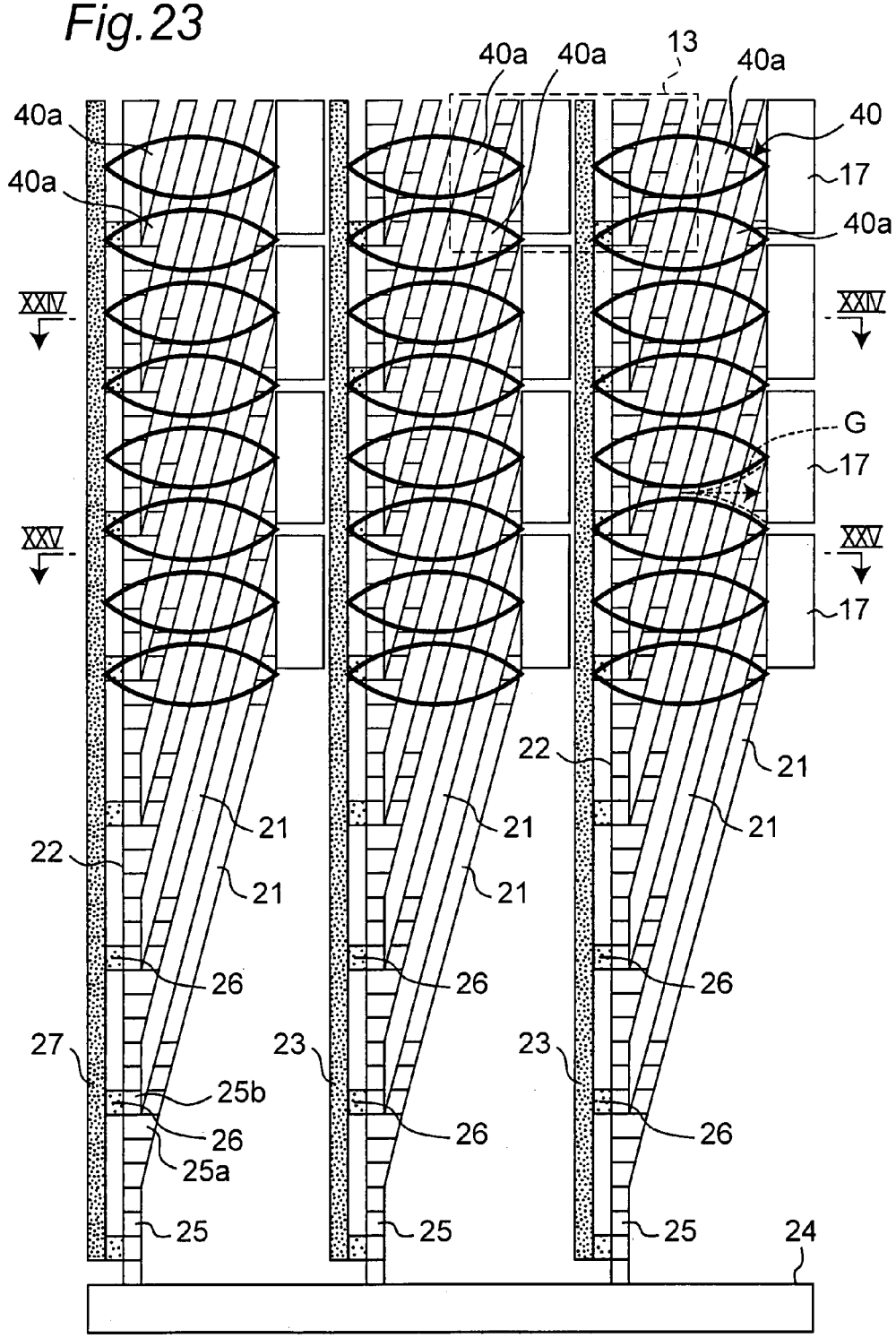
FIG. 23 is a schematic diagram showing a back illuminated imaging device according to a third embodiment as viewed from an incidence direction.
Figure 24:
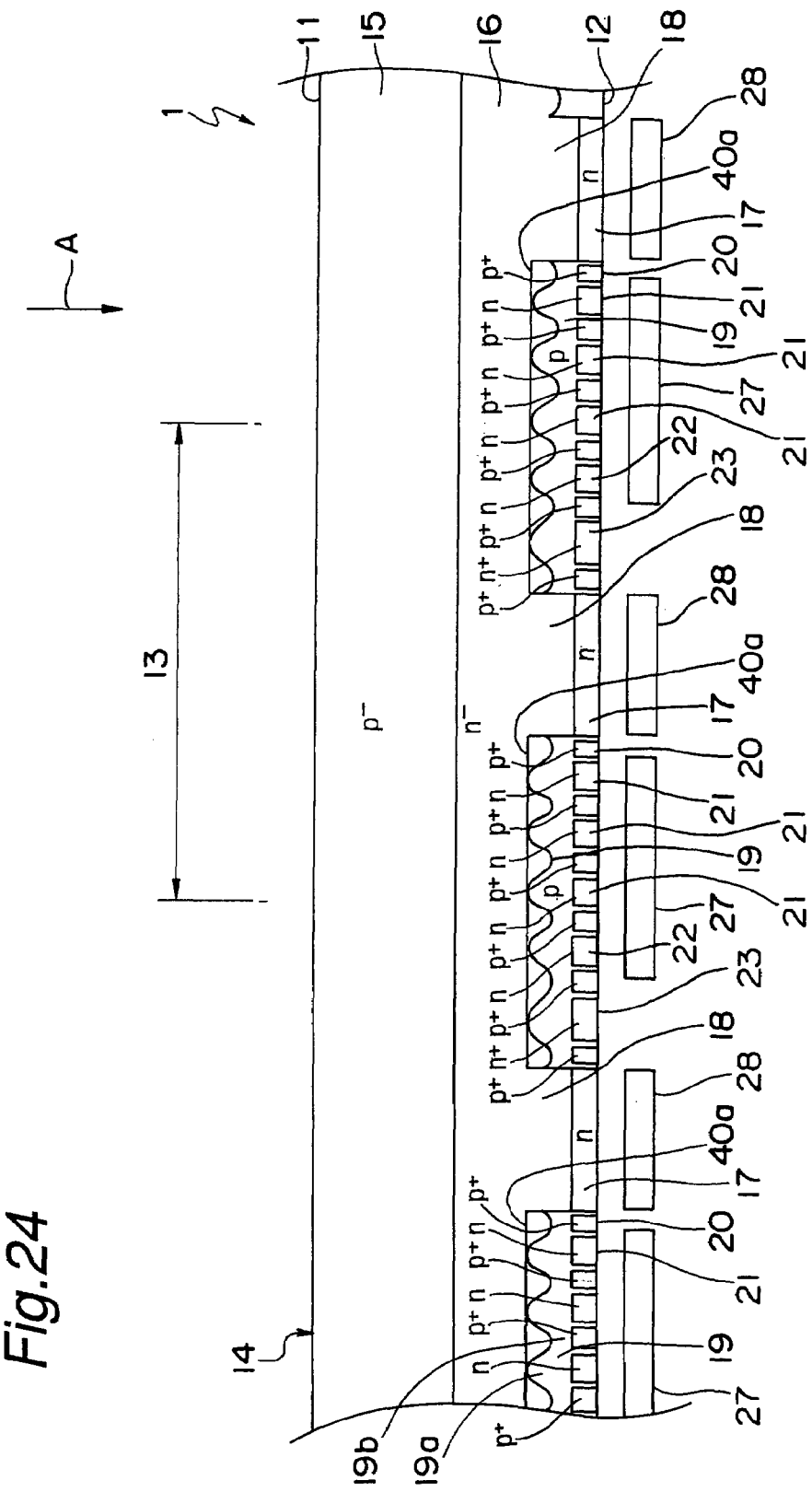
FIG. 24 is a cross sectional view taken along a line XXIV-XXIV of FIG. 23.
Figure 25:
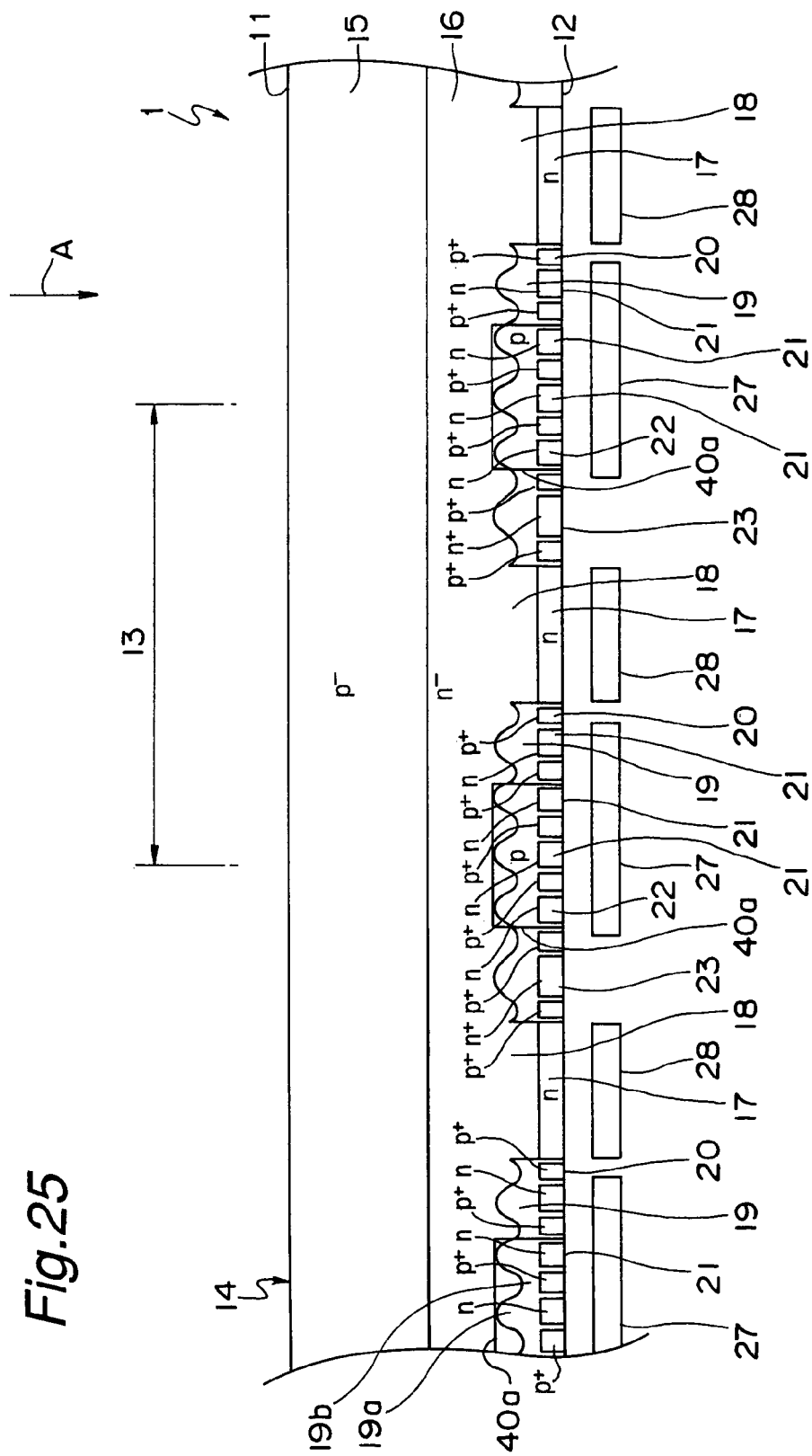
FIG. 25 is a cross sectional view taken along a line XXV-XXV of FIG. 23.

FIG. 23 to FIG. 25 show a back illuminated imaging device 1 according to a third embodiment of the present invention. A p-type impurity doped layer 40 is provided from the front surface 12 side of the chip 14 on portions corresponding to the charge blocking regions 19. As shown in FIG. 23, when viewed from an incidence direction of the light A, the impurity doped layer 40 is constituted by a plurality of portions 40a arranged in the row direction of the pixels 13. The width of the individual portions 40a in the row direction of the pixels becomes gradually narrower toward the input region 17, thereby presenting a convex lens shape. Also by providing the impurity doped layer 40, an electric potential gradient is formed facing the input regions 17 of the charge collecting layer 16, thereby improving the movement speed of electrons in the charge collecting layer 16. Furthermore, by setting the shape of the individual portion of the impurity doped layer 40 into a convex lens shape as viewed from the incidence direction, the charges produced in the photoelectric converting layer 15 of each of the pixels 13 moves smoothly toward the corresponding input region 17 (see the dashed line of arrow G in FIG. 23).

Figure 26:
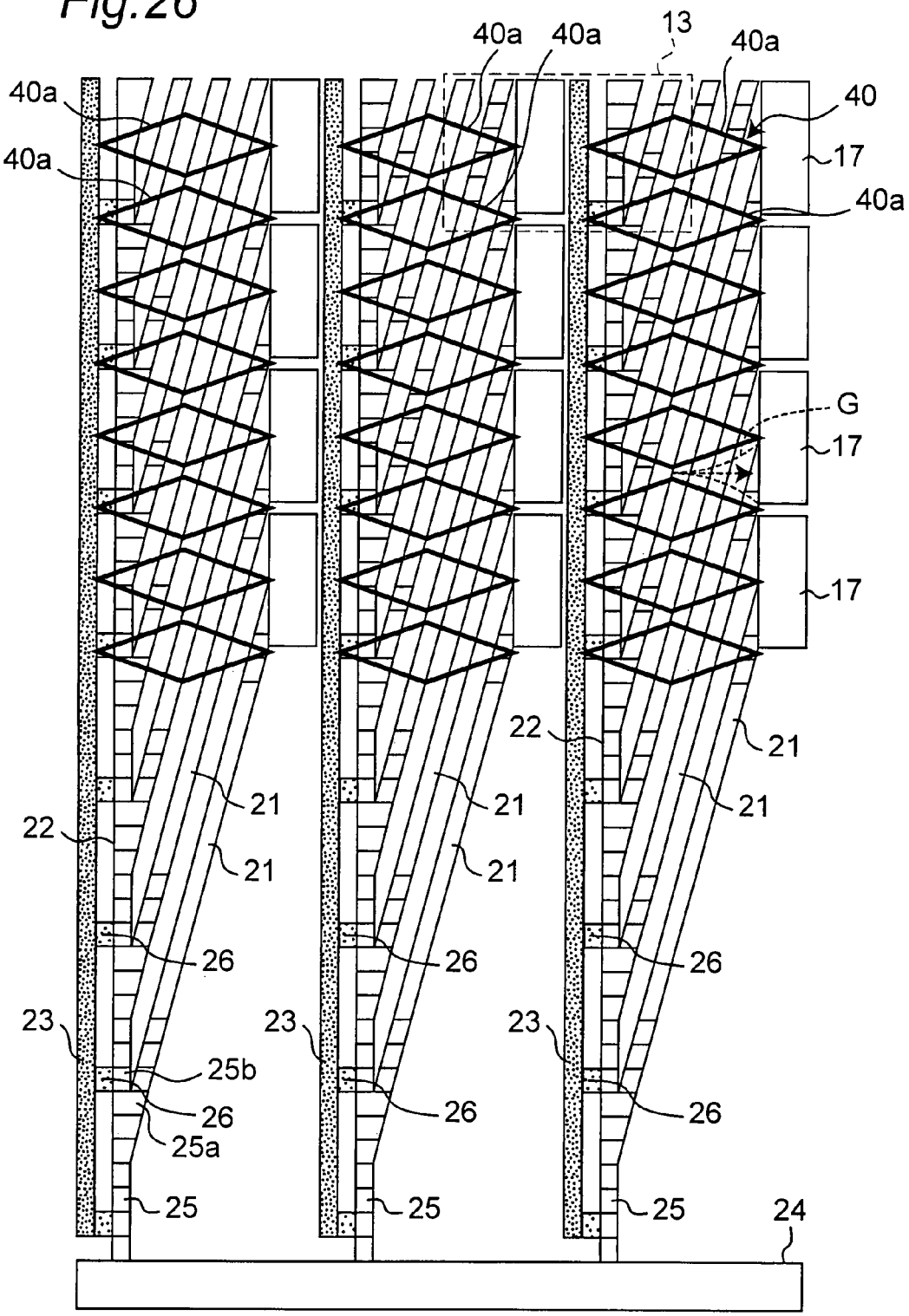
FIG. 26 is a schematic diagram showing a back illuminated imaging device according to a modified example of the third embodiment as viewed from an incidence direction.
Figure 27:
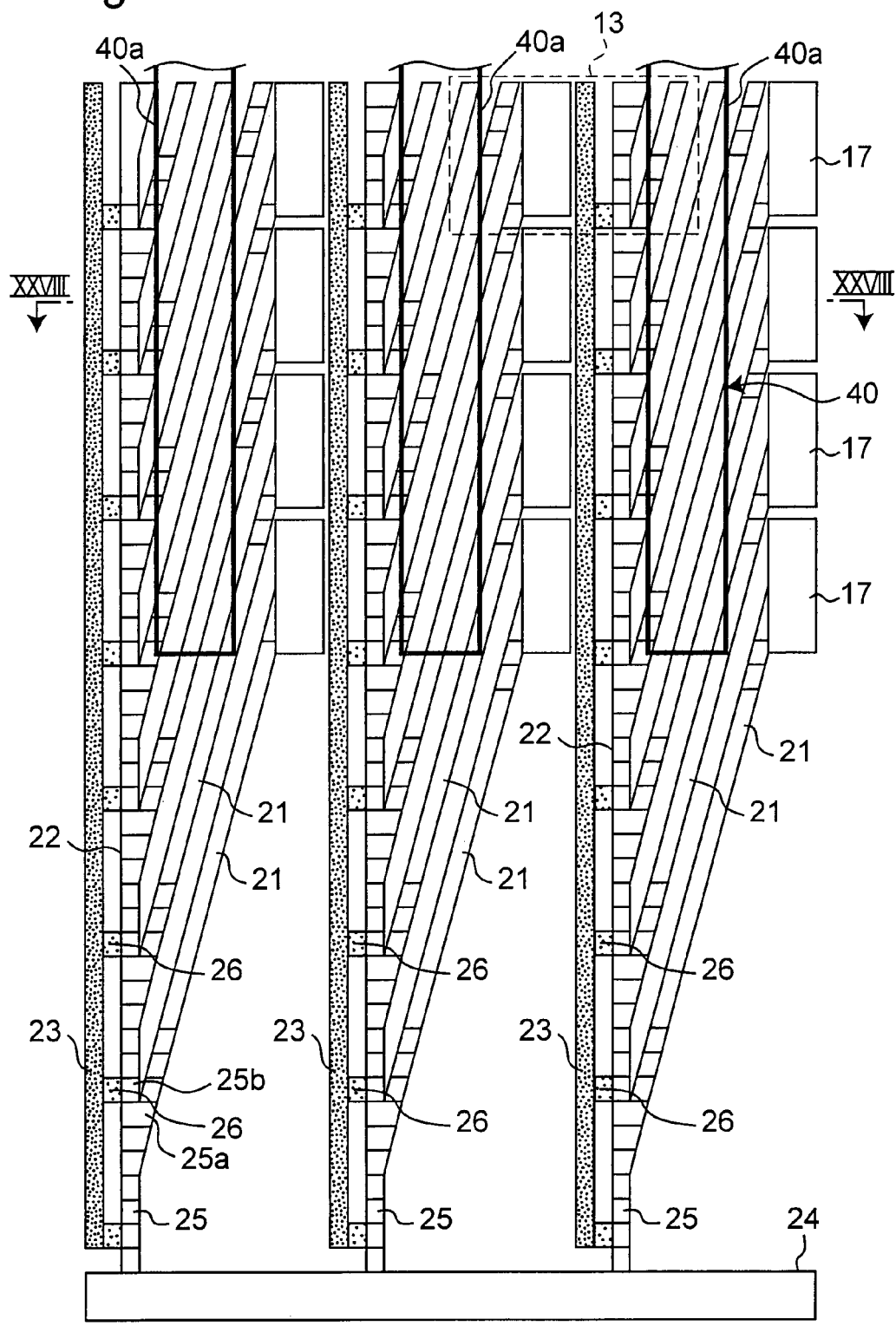
FIG. 27 is a schematic diagram showing a back illuminated imaging device according to a different modified example of the third embodiment as viewed from an incidence direction.
Figure 28:
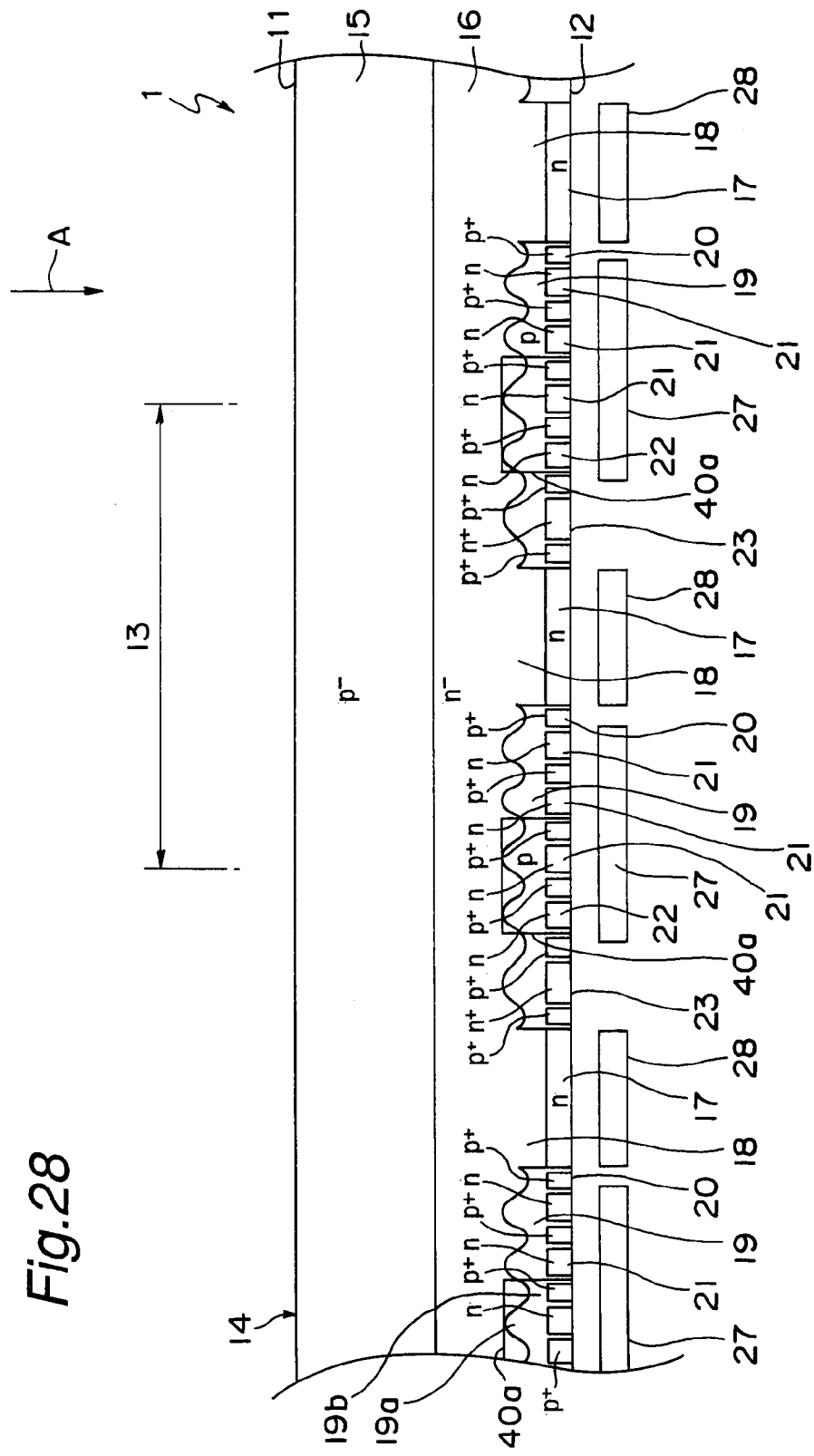
FIG. 28 is a cross sectional view taken along a line XXVIII-XXVIII of FIG. 27.

As shown in FIG. 26, individual portions 40a of the p-type impurity doped layer 40 may be diamond shaped. Contours of the portions 40a in FIG. 23 and FIG. 26 may be formed having fine zigzag lines. Furthermore, as shown in FIG. 27 and FIG. 28, individual portions 40a of the impurity doped layer 40 may have a band shape extending in the row direction of the pixels 13 as viewed from the incidence direction of the light A. Further still, instead of the impurity doped layer 40, a same effect may be obtained by forming an n-type impurity doped layer in portions other than those corresponding to the impurity doped layer 40 of the front surface of the chip 14.

The present invention is not limited to the foregoing embodiments and various modifications are possible. For example, the incident beam may be an electromagnetic wave other than light rays, a flow of charged particles such as ions and positive holes other than electron rays, alpha rays, gamma rays, and beta rays in addition to X rays, and radiation including neutron beams. When the incident beam is radiation, scintillators may be arranged on the incident surface side of the imaging device and light rays produced by the scintillators may be made incident on the imaging element in response to the intensity of radiation.

The signal charges may be positive holes. In this case, the photoelectric converting layer, the charge collecting layer, the input region, the charge accumulation portion, the charge blocking regions, and the conductive type of the CCDs are reverse to the case of the foregoing embodiments.

Figure 29:
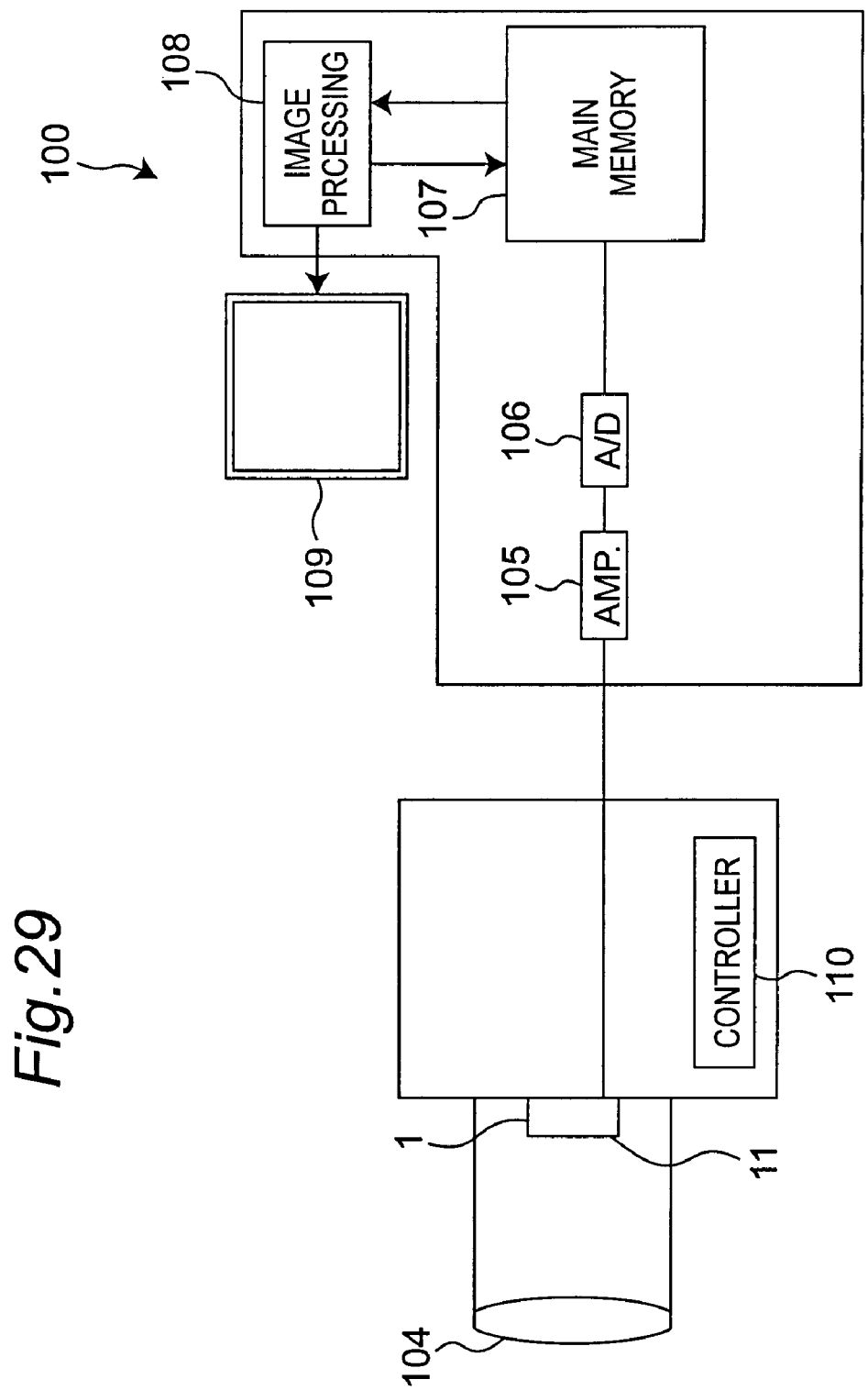
FIG. 29 is a schematic diagram showing one example of a high speed imaging device provided with a back illuminated imaging device according to the present invention.
Figure 30:
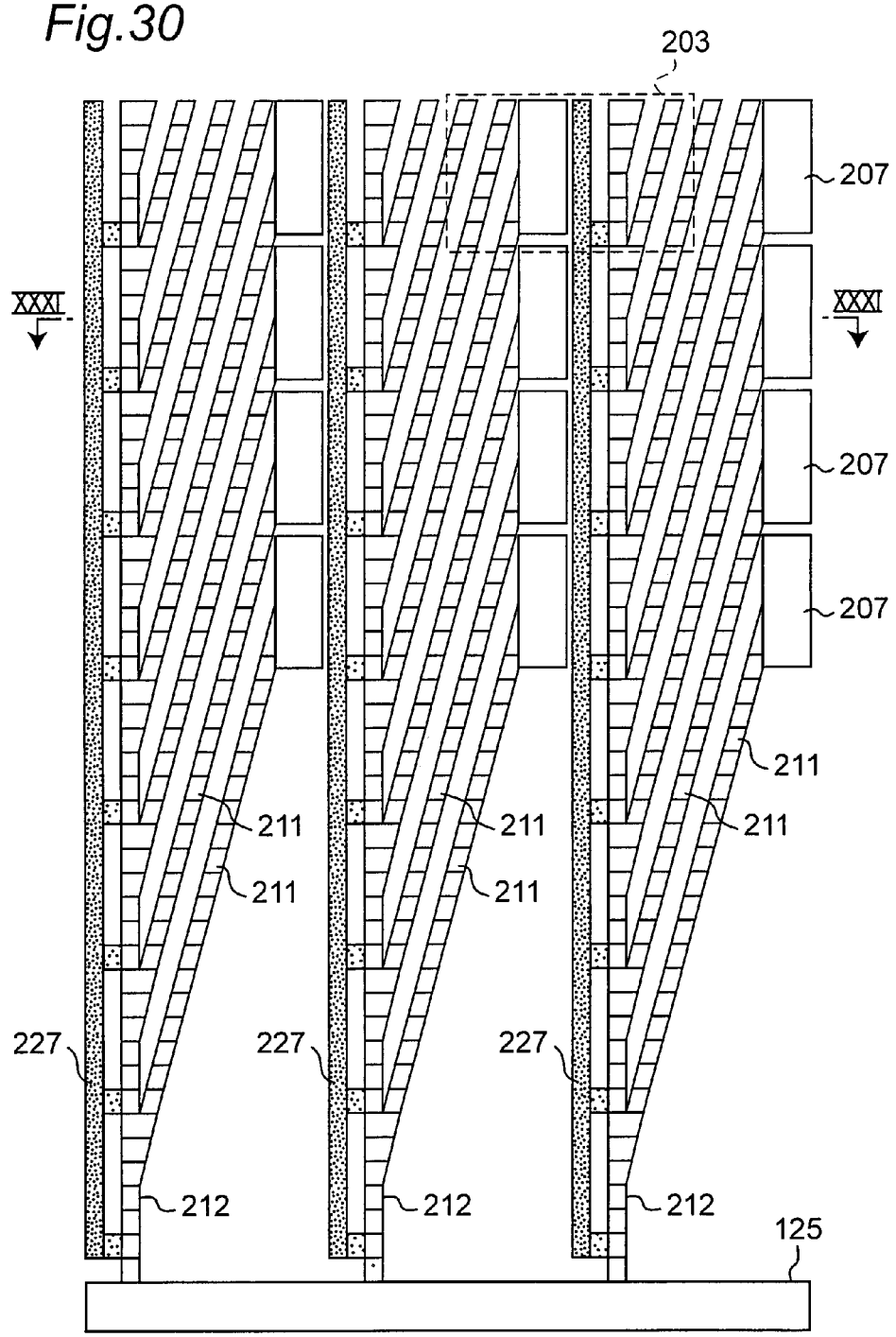
FIG. 30 is a schematic diagram showing one example of a conventional back illuminated imaging device as viewed from an incidence direction.
Figure 31:
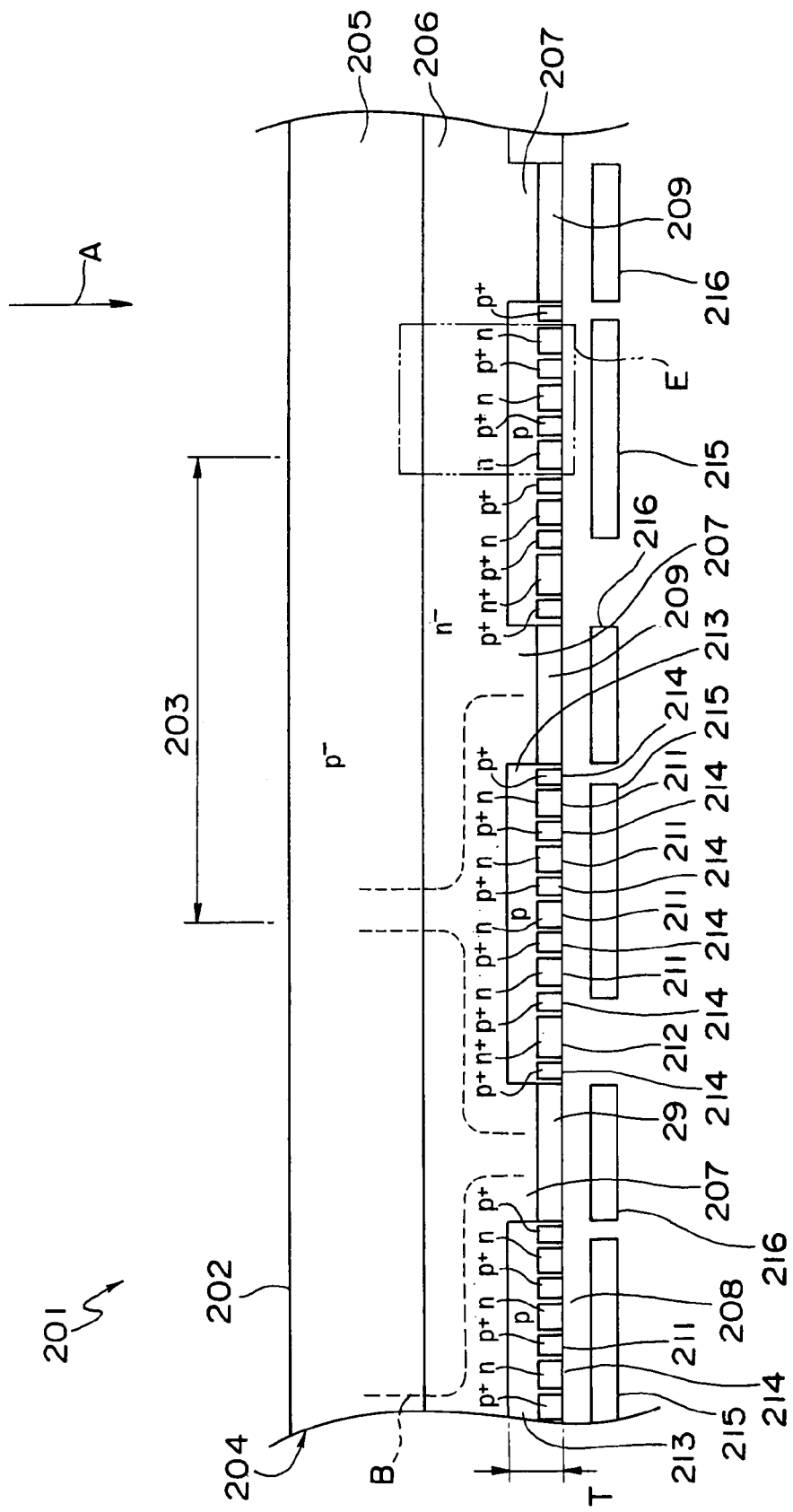
FIG. 31 is a cross sectional view taken along a line XXXI-XXXI of FIG. 30.

The back illuminated imaging device 1 can also be used in a high speed video camera 100 such as that shown in FIG. 29. The high speed video camera 100 is provided with lens 104 that focus visible light onto the incident surface 11, an amp 105 that amplifies analog image signals outputted from a back illuminated imaging device 101, an A/D converter 106 that converts amplified image signals into digital signals, and a main memory 107 that stores digital image signals. An image processing device 108 processes image signals that are read out from the main memory 107 for display on a display device 109. A controller 110 controls overall operations of the video camera including the imaging device 101, the amp 105, and the A/D converter 106.

The invention claimed is:

1. A back illuminated imaging device, comprising:
   a first conductive type converting layer which is provided on a back surface side where an incident beam is irradiated, and which converts the incident beam to signal charges;
   a plurality of second conductive type input regions provided respectively on a front surface side of an opposite side to the back surface for a plurality of pixels configured in a two-dimensional array;
   a plurality of second conductive type CCD charge transferring paths which are provided on the front surface side for each of the plurality of input regions, and which extend parallel to each other and transfer signal charges from the corresponding input regions,
   a second conductive type charge collecting layer which is provided adjacent to the front surface side of the converting layer, and which moves the charges produced at the converting layer toward the input regions,
   a plurality of second conductive type charge accumulation portions which extend from the charge collecting layer to each of the input regions, and
   a plurality of first conductive type charge blocking regions which are provided on the front surface side and in which the CCD charge transferring paths are embedded and an impurity concentration of a first portion extending along the CCD charge transferring paths is higher than an impurity concentration of a second portion extending along gaps between the adjacent CCD charge transferring paths.

2. The back illuminated imaging device according to claim 1, wherein first conductive type channel stops having an impurity concentration higher than that of the charge blocking regions are further provided between the adjacent CCD charge transferring paths.

3. The back illuminated imaging device according to claim 1 or claim 2, wherein an impurity concentration of a photoelectric converting layer in portions corresponding to the charge blocking regions is higher than an impurity concentration of the photoelectric converting layer in portions corresponding to the input regions.

4. The back illuminated imaging device according to claim 1 or claim 2, wherein second conductive type impurities are implanted in a surface of portions corresponding to the charge blocking regions.

5. The back illuminated imaging device according to claim 1 or claim 2, wherein a first conductive type impurity doped layer is further provided in portions corresponding to the charge blocking regions.

6. The back illuminated imaging device according to claim 5, wherein the impurity doped layer is arranged in a row direction of the pixels when viewed from an incidence direction of the incident beam and is constituted by a plurality of portions, each of whose width becomes narrower in the row direction of the pixels facing the input regions.

7. The back illuminated imaging device according to claim 5, wherein the impurity doped layer is band shaped extending in the row direction of the pixels when viewed from an incidence direction of the incident beam.

8. A back illuminated imaging device, comprising:
a first conductive type converting layer which is provided on a back surface side where an incident beam is irradiated, and which converts the incident beam to signal charges;
a plurality of second conductive type input regions provided respectively on a front surface side of an opposite side to the back surface for a plurality of pixels configured in a two-dimensional array;
a plurality of second conductive type CCD charge transferring paths which are provided on the front surface side for each of the plurality of input regions and which extend parallel to each other and in which signal charges from the corresponding input regions are moved;
a second conductive type charge collecting layer which is provided adjacent to the front surface side of the converting layer and which moves the charges produced at the converting layer toward the input regions;
a plurality of second conductive type charge accumulation portions which extend from the charge collecting layer to each of the input regions; and
a plurality of first conductive type charge blocking regions which are arranged on the front surface side and in which the CCD charge transferring paths are embedded, wherein
an impurity concentration of a photoelectric converting layer in portions corresponding to the charge blocking regions is lower than an impurity concentration of the photoelectric converting layer in portions corresponding to the input regions.

9. A back illuminated imaging device, comprising:
a first conductive type converting layer which is provided on a back surface side where an incident beam is irradiated, and which converts the incident beam to signal charges;
a plurality of second conductive type input regions provided respectively on a front surface side of an opposite side to the back surface for a plurality of pixels configured in a two-dimensional array;
a plurality of second conductive type CCD charge transferring paths which are provided on the front surface side for each of the plurality of input regions and which extend parallel to each other and in which signal charges from the corresponding input regions are moved;
a second conductive type charge collecting layer which is provided adjacent to the front surface side of the converting layer and which moves the charges produced at the converting layer toward the input regions;
a plurality of second conductive type charge accumulation portions which extend from the charge collecting layer to each of the input regions,
charge blocking regions which are arranged on the front surface side and in which the CCD charge transferring paths are embedded, and
a first conductive type impurity doped layer arranged in portions corresponding to the charge blocking regions.

10. The back illuminated imaging device according to claim 9, wherein the impurity doped layer is arranged in a row direction of the pixels when viewed from an incidence direction of the incident beam and is constituted by a plurality of portions, each of whose width becomes narrower in the row direction of the pixels facing the input regions.

11. The back illuminated imaging device according to claim 9, wherein the impurity doped layer is band shaped extending in the row direction of the pixels when viewed from an incidence direction of the incident beam.

* * * * *